(12) United States Patent
Lee et al.

(10) Patent No.: US 10,455,308 B2
(45) Date of Patent: Oct. 22, 2019

(54) DIE WITH INTEGRATED MICROPHONE DEVICE USING THROUGH-SILICON VIAS (TSVS)

(71) Applicant: Intel Corporation, Santa Clara, CA (US)

(72) Inventors: Kevin J. Lee, Beaverton, OR (US); Ruchir Saraswat, Swindon (GB); Uwe Zillmann, Braunschweig (DE); Valluri Bob Rao, Saratoga, CA (US); Tor Lund-Larsen, Braunschweig (DE); Nicholas P. Cowley, Wroughton (GB)

(73) Assignee: Intel Corporation, Santa Clara, CA (US)

( * ) Notice: Subject to any disclaimer, the term of this patent is extended or adjusted under 35 U.S.C. 154(b) by 203 days.

(21) Appl. No.: 15/502,495

(22) PCT Filed: Sep. 17, 2014

(86) PCT No.: PCT/US2014/056133
§ 371 (c)(1),
(2) Date: Feb. 7, 2017

(87) PCT Pub. No.: WO2016/043738
PCT Pub. Date: Mar. 24, 2016

(65) Prior Publication Data
US 2017/0245035 A1      Aug. 24, 2017

(51) Int. Cl.
*H04R 19/04*     (2006.01)
*H04R 1/04*      (2006.01)
(Continued)

(52) U.S. Cl.
CPC .................. *H04R 1/04* (2013.01); *B81B 7/02* (2013.01); *B81C 1/00158* (2013.01);
(Continued)

(58) Field of Classification Search
CPC ........ H04R 1/04; H04R 1/406; H04R 19/005; H04R 19/04; H04R 2201/003; B81B 7/0061; B81B 2201/0257; B81C 1/00158
(Continued)

(56) References Cited

U.S. PATENT DOCUMENTS 6,522,762 B1    2/2003   Mullenborn et al.
8,823,116 B2 *  9/2014   Weber ................... B81B 3/0018
                                                      257/254

(Continued)

FOREIGN PATENT DOCUMENTS

JP      2005522861 A     7/2005
JP      2006211468 A     8/2006
(Continued)

OTHER PUBLICATIONS

Extended European Search Report dated Mar. 28, 2018 for European Patent Application No. 14901871.5, 7 pages.
(Continued)

*Primary Examiner* — Huyen D Le
(74) *Attorney, Agent, or Firm* — Schwabe, Williamson & Wyatt, P.C.

(57) ABSTRACT

Embodiments of the present disclosure describe a die with integrated microphone device using through-silicon vias (TSVs) and associated techniques and configurations. In one embodiment, an apparatus includes an apparatus comprising a semiconductor substrate having a first side and a second side disposed opposite to the first side, an interconnect layer formed on the first side of the semiconductor substrate, a through-silicon via (TSV) formed through the semiconductor substrate and configured to route electrical signals between the first side of the semiconductor substrate and the second side of the semiconductor substrate, and a microphone device formed on the second side of the semiconduc-
(Continued)

tor substrate and electrically coupled with the TSV. Other embodiments may be described and/or claimed.

21 Claims, 12 Drawing Sheets

(51) Int. Cl.
*B81B 7/02* (2006.01)
*H01L 23/00* (2006.01)
*H01L 21/683* (2006.01)
*H01L 23/48* (2006.01)
*B81C 1/00* (2006.01)
*H01L 21/768* (2006.01)
*H04R 1/40* (2006.01)
*H04R 19/00* (2006.01)

(52) U.S. Cl.
CPC ...... *H01L 21/6835* (2013.01); *H01L 21/6836* (2013.01); *H01L 21/76898* (2013.01); *H01L 23/481* (2013.01); *H01L 24/32* (2013.01); *H04R 1/406* (2013.01); *H04R 19/005* (2013.01); *H04R 19/04* (2013.01); *B81B 2201/0257* (2013.01); *B81B 2207/096* (2013.01); *B81C 2201/0132* (2013.01); *B81C 2203/0109* (2013.01); *H01L 24/13* (2013.01); *H01L 24/16* (2013.01); *H01L 24/27* (2013.01); *H01L 24/29* (2013.01); *H01L 24/83* (2013.01); *H01L 2221/6834* (2013.01); *H01L 2221/68327* (2013.01); *H01L 2221/68381* (2013.01); *H01L 2224/131* (2013.01); *H01L 2224/16227* (2013.01); *H01L 2224/27002* (2013.01); *H01L 2224/27618* (2013.01); *H01L 2224/27848* (2013.01); *H01L 2224/29011* (2013.01); *H01L 2224/2919* (2013.01); *H01L 2224/3201* (2013.01); *H01L 2224/32058* (2013.01); *H01L 2224/32225* (2013.01); *H01L 2224/32245* (2013.01); *H01L 2224/73204* (2013.01); *H01L 2224/83005* (2013.01); *H01L 2224/8346* (2013.01); *H01L 2224/8359* (2013.01); *H01L 2224/83193* (2013.01); *H01L 2224/83438* (2013.01); *H01L 2224/83488* (2013.01); *H01L 2224/83688* (2013.01); *H01L 2224/83862* (2013.01); *H01L 2224/92* (2013.01); *H01L 2224/9222* (2013.01); *H01L 2224/92225* (2013.01); *H01L 2924/1461* (2013.01); *H01L 2924/15311* (2013.01); *H01L 2924/161* (2013.01); *H01L 2924/163* (2013.01); *H01L 2924/166* (2013.01); *H01L 2924/16151* (2013.01); *H01L 2924/16152* (2013.01)

(58) Field of Classification Search
USPC ....... 381/113, 116, 369, 173, 174, 175, 191; 257/416; 438/51, 53; 367/181
See application file for complete search history.

(56) References Cited

U.S. PATENT DOCUMENTS

| | | |
|---|---|---|
| 2007/0158826 A1 | 7/2007 | Sakakibara et al. |
| 2011/0198747 A1 | 8/2011 | Kuo et al. |
| 2011/0241137 A1 | 10/2011 | Huang et al. |
| 2012/0237073 A1 | 9/2012 | Goida et al. |
| 2012/0261775 A1 | 10/2012 | Wang et al. |
| 2013/0119492 A1* | 5/2013 | Feiertag .............. B81C 1/00238 257/416 |
| 2013/0334626 A1 | 12/2013 | Weber |
| 2014/0084395 A1* | 3/2014 | Sparks ................... G01L 9/008 257/416 |

FOREIGN PATENT DOCUMENTS

| | | |
|---|---|---|
| JP | 2008507416 A | 3/2008 |
| JP | 2009081624 A | 4/2009 |
| JP | 2009200233 A | 9/2009 |
| JP | 2010035156 A | 2/2010 |
| JP | 2011176531 A | 9/2011 |
| JP | 2012019322 A | 1/2012 |
| JP | 2012517183 A | 7/2012 |
| JP | 2012175336 A | 9/2012 |
| WO | WO2013/129444 A1 | 9/2013 |

OTHER PUBLICATIONS

International Search Report and Written Opinion dated Jun. 18, 2015, issued in corresponding International Application No. PCT/US2014/056133, 14 pages.
International Preliminary Report on Patentability dated Mar. 30, 2017, issued in corresponding International Application No. PCT/US2014/056133, 11 pages.
Office Action dated Sep. 4, 2018 for Japanese Patent Application No. 2017-505471, 8 pages.
Office Action dated Feb. 20, 2019 for European Patent Application No. 14901871.5, 6 pages.
Office Action dated May 14, 2019 for Japanese Patent Application No. 2017-505471, 19 pages.

* cited by examiner

US 10,455,308 B2

DIE WITH INTEGRATED MICROPHONE DEVICE USING THROUGH-SILICON VIAS (TSVS)

CROSS-REFERENCE TO RELATED APPLICATION

The present application is a national phase entry under 35 U.S.C. § 371 of International Application No. PCT/US2014/056133, filed Sep. 17, 2014, entitled "DIE WITH INTEGRATED MICROPHONE DEVICE USING THROUGH-SILICON VIAS (TSVS)," which designates the United States of America, the entire disclosure of which is hereby incorporated by reference in its entirety and all purposes.

FIELD

Embodiments of the present disclosure generally relate to the field of integrated circuits, and more particularly, to a die with integrated microphone device using through-silicon vias (TSVs) and associated techniques and configurations.

BACKGROUND

Microphone devices are widely used in a variety of devices including, for example, communication devices, hearing aids, acoustic distinction under water and noise control. The industry trend towards miniaturization of electronic devices is currently driving integration of micro electromechanical system (MEMS)-based microphone devices in semiconductor chips. However, such integration may be fraught with difficulty owing to limited space on a semiconductor chip and the fragile nature of active circuitry on the semiconductor chip. Integration of a MEMS-based microphone with the active circuitry may open a window to the ambient environment, which may facilitate introduction of corrosive or otherwise harmful materials to the active circuitry. Integration of a microphone device on an active side of a semiconductor chip may require a larger, more costly chip.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
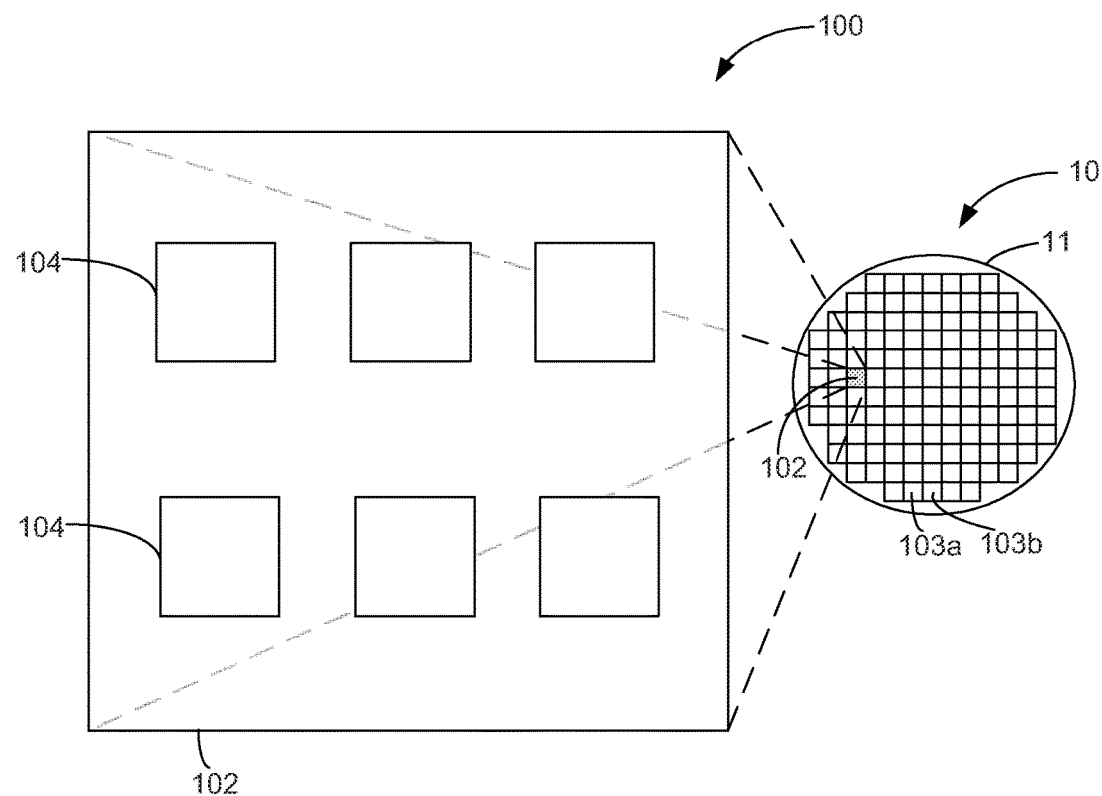
FIG. 1 schematically illustrates a top view of an example die in wafer form and in singulated form, in accordance with some embodiments.

Embodiments of the present disclosure describe a die with integrated microphone device using through-silicon vias (TSVs) and associated techniques and configurations. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that includes one or more microphone devices 104 as described herein. The die 102 may include circuitry having transistor structures such as, for example, one or more channel bodies (e.g., fin structures, nanowires, planar bodies, etc.) that provide a channel pathway for mobile charge carriers of one or more transistor devices or source/drain regions. In some embodiments, the circuitry may include receiver circuitry, sensor circuitry or other circuitry of the microphone device. Interconnect structures such as, for example, contacts, vias and/or trenches may be formed on and coupled with the one or more transistor structures to route electrical energy to or from the transistor structures. For example, interconnect structures may be electrically coupled with a channel body to provide a gate electrode for delivery of a threshold voltage and/or a source/drain current to provide mobile charge carriers for operation of a transistor device. Although the one or more microphone devices 104 are depicted in a particular configuration in FIG. 1 for the sake of simplicity, it is to be understood that the one or more microphone devices 104 may be configured in any of a wide variety of other suitable arrangements on the die 102 in other embodiments and may have smaller or larger dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. In some embodiments, the wafer 11 may be a thinned wafer. According to various embodiments, the microphone devices 104 may be disposed on a semiconductor substrate in wafer form 10 or singulated form 100. The microphone devices 104 described herein may be incorporated in a die 102 for logic or memory, or combinations thereof. In some embodiments, the microphone devices 104 may be part of a system-on-chip (SoC) assembly.

Figure 2:
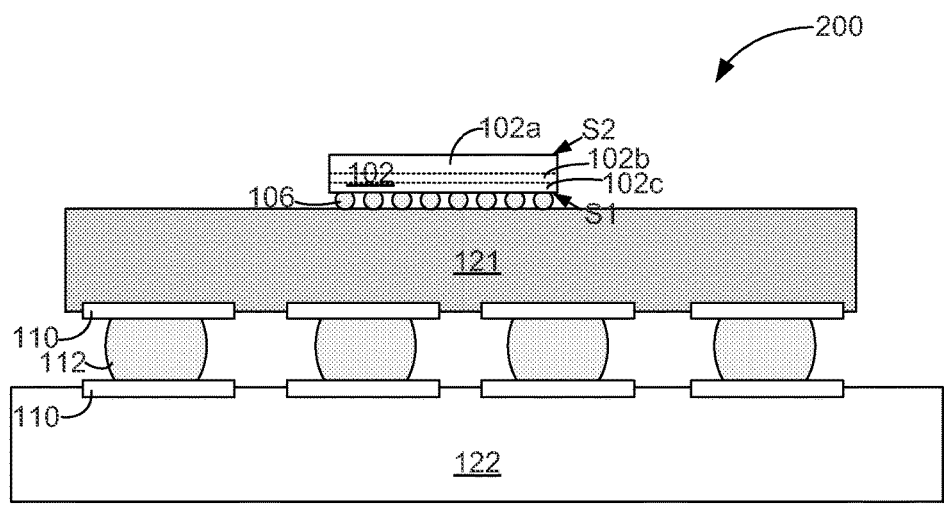
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen. In some embodiments, an integrated circuit (IC) assembly 200 may include the die 102 and one or more of the package substrate 121 and/or circuit board 122, according to various embodiments.

The die 102 may represent a discrete product made from a semiconductor material (e.g., silicon) using semiconductor fabrication techniques such as thin film deposition, lithography, etching and the like used in connection with forming CMOS devices. In some embodiments, one or more microphone devices (e.g., one or more microphone devices 104 of FIG. 1) may be formed on the die 102. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, a first side (sometimes referred to as "active side"), S1, of the die 102 including circuitry is attached to a surface of the package substrate 121 using die-level interconnect structures 106 such as bumps, pillars, or other suitable structures that may also electrically couple the die 102 with the package substrate 121. The first side S1 of the die 102 may include active devices such as, for example, transistor devices. A second side (sometimes referred to as "inactive side"), S2, may be disposed opposite to the first side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example, silicon, in some embodiments. The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts. In some embodiments, through-silicon vias (TSVs) may be formed through the semiconductor substrate 102a to electrically couple circuitry of the device layer 102b or interconnect layer 102c with features disposed on the second side S2. Although "TSV" or "TSVs" may be used throughout the description, it is to be understood that these terms do not necessarily limit the described structures to silicon-based substrates only. That is, "TSV" or "TSVs" may generally refer to through-substrate vias that are formed through other suitable substrate materials. The device layer 102b and interconnect layer 102c may each represent multiple layers in some embodiments.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1602 of FIG. 16).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
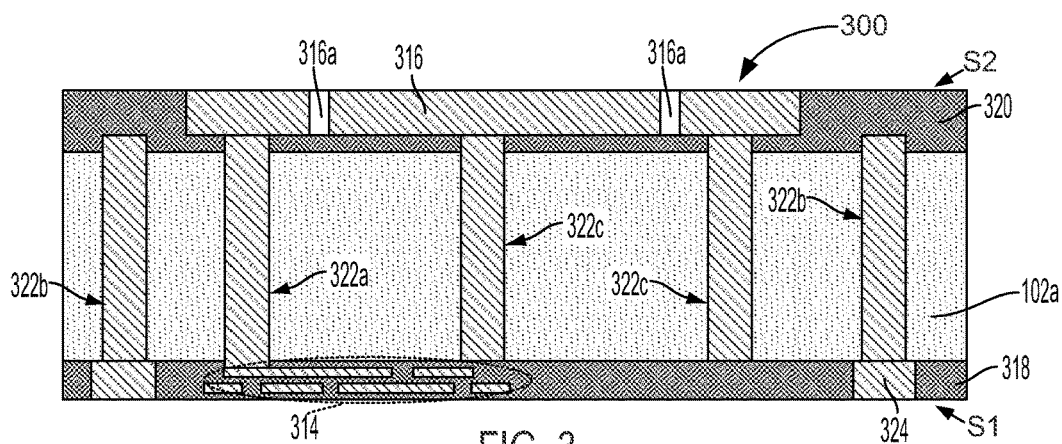
FIG. 3 schematically illustrates a cross-section side view of a capacitive transducer assembly, in accordance with some embodiments.

FIG. 3 schematically illustrates a cross-section side view of a capacitive transducer assembly 300, in accordance with some embodiments. According to various embodiments, the capacitive transducer assembly 300 may include a semiconductor substrate 102a (e.g., of a die 102 or wafer 11 of FIG. 1), having circuitry (e.g., circuitry 314) formed on a first side S1 of the semiconductor substrate 102a, a back-plate 316 formed on a second side S2 of the semiconductor substrate, and through-silicon vias (TSVs) 322a, 322b, 322c formed through the semiconductor substrate 102a, as can be seen.

In some embodiments, the circuitry 314 may include active circuitry such as, for example, receiver or sensor circuitry of a microphone device. In some embodiments, the circuitry 314 may include device layer 102b of FIG. 2. The circuitry 314 may further include interconnect structures (e.g., trenches or vias) of one or more interconnect layers. In some embodiments, the circuitry 314 may include interconnect layer 102c of FIG. 2. The circuitry 314 may be disposed in a dielectric material 318 and the back-plate 316 may be disposed in a dielectric material 320. The dielectric material 318, 320 may include any suitable material such as, for example, silicon oxide ($SiO_2$) and the like.

In some embodiments, the back-plate 316 may be formed by patterning a redistribution layer (RDL) on the second side S2 of the semiconductor substrate 102a. In some embodiments, the back-plate 316 may include one or more openings 316a formed through the back-plate 316.

Through-silicon vias (TSVs) 322a, 322b, 322c may be formed through the semiconductor substrate 102a, as can be seen. In some embodiments, one or more of the TSVs may be a signal TSV 322a configured to route electrical signals between the circuitry 314 on the first side S1 and components of a microphone device on the second side S2 such as the back-plate 316. In some embodiments, when in operation, the back-plate 316 may be configured to serve as an electrically active sensing electrode and the signal TSV 322a may be configured to provide an electrical connection to circuitry 314 (e.g., sensor circuitry).

One or more of the TSVs may be ground TSVs 322b configured to route ground signals between features on the first side S1 and second side S2 of the semiconductor substrate 102a. In some embodiments, the ground TSVs 322b may be coupled with interconnect structures 324 (e.g., pads or contacts) on the first side S1 that are configured to electrically couple with another electrical device (e.g., another die, package substrate, interposer or circuit board) external to the capacitive transducer assembly 300.

One or more of the TSVs may be support TSVs 322c that are configured to structurally support components of the microphone device such as the back-plate 316. For example, the support TSVs 322c may be dummy TSVs that function as support pillars. The support TSVs 322c may not be configured to route electrical signals between the circuitry 314 and the back-plate 316. In one embodiment, the support TSVs 322c may include at least a portion that is filled with electrically insulative material.

According to various embodiments, the semiconductor substrate 102a may represent a portion of a die 102 in wafer form 10 or singulated form 100 as described in connection with FIG. 1. The capacitive transducer assembly 300 may be used as part of a single microphone or as part of an array of microphones, in some embodiments.

Figure 4:
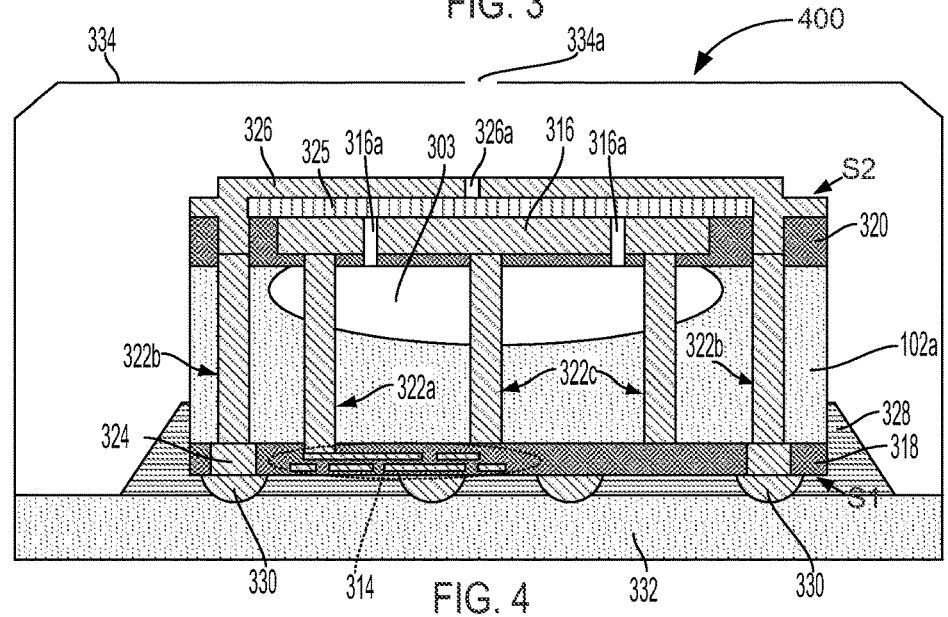
FIG. 4 schematically illustrates a cross-section side view of a microphone assembly, in accordance with some embodiments.

FIG. 4 schematically illustrates a cross-section side view of a microphone assembly 400, in accordance with some embodiments. In some embodiments, the microphone assembly 400 may include the capacitive transducer assembly 300 of FIG. 3. For example, according to various embodiments, the microphone assembly 400 may include a semiconductor substrate 102a (e.g., of a die 102 or wafer 11 of FIG. 1), having circuitry (e.g., circuitry 314) formed on a first side S1 of the semiconductor substrate 102a, a back-plate 316 formed on a second side S2 of the semiconductor substrate, and through-silicon vias (TSVs) 322a, 322b, 322c formed through the semiconductor substrate 102a, as can be seen. The microphone assembly 400 may further include a membrane film 326 coupled with the back-plate 316 to form a capacitor and a chamber 303 formed in the semiconductor substrate 102a adjacent to (e.g., underlying) the membrane film 326, as can be seen.

One or more openings 316a may be formed through the back-plate 316 and/or dielectric material 320 and one or more openings 326a may be formed through the membrane film 326. A sacrificial material 325 may be disposed between the membrane film 326 and the back-plate 316. The sacrificial material 325 may be removed during fabrication of the microphone assembly 400 to provide an air gap in the region occupied by the sacrificial material 325. The chamber 303, openings 316a, 326a, and region of the sacrificial material 325 may be filled with any suitable gas to form including, for example, air in various embodiments. The openings 316a, 326a may provide vent holes. In some embodiments, a microphone device (e.g., microphone device 104 of FIG. 1) of the microphone assembly 400 may include one or more of the back-plate 316, the membrane film 326, the chamber 303, TSVs 322a, 322b, 322c, openings 316a, 326a, air gap in region occupied by sacrificial material 325 and/or circuitry 314. Forming the components of the microphone device on the backside (e.g., second side S2) opposite to the circuitry 314 may provide space that allows for a phase array of microphone devices on the backside. Such configuration may allow modification of the microphone acoustic response by digital delay-and-sum beam forming according to a desired acoustic polar pattern (directionally) such as, for example, omnidirectional or (hyper-) cardioid and for increasing sensitivity.

In some embodiments, the semiconductor substrate 102a and components of the microphone device may be mounted on a package substrate 332. For example, in the depicted embodiment, the first side S1 is coupled with package substrate 332 using solder bumps 330. An underfill material 328 such as epoxy-based underfill or other suitable electrically insulative material may be disposed between the semiconductor substrate 102a and the package substrate 332, as can be seen. The solder bumps 330 may be configured to route electrical signals between the package substrate 332 and circuitry 314 or other components of the microphone device including, for example, power/ground and/or input/output (I/O) signals. The semiconductor substrate 102a may be coupled with the package substrate 332 using other suitable techniques and configurations in other embodiments.

In some embodiments, the microphone assembly 400 may include a lid 334 configured to cover components of the microphone device. The lid 334 may, for example, be composed of a metal and may be coupled with the package substrate 332 upon which the semiconductor substrate 102a is mounted. The lid 334 may be coupled with the package substrate 332 (e.g., flip-chip substrate) to form a cavity that encloses the die (e.g., semiconductor substrate 102a and features formed on the first side S1 and second side S2).

In some embodiments, the lid 334 may include one or more openings 334a to provide a sound port of the microphone assembly 400 to allow sound to enter the cavity for operation of the microphone device. In some embodiments, a top port (e.g., one or more openings 334a) may be suitable for tablet devices. The lid 334 may provide electromagnetic interference (EMI) shielding for components of the microphone assembly 400 covered by the lid 334. According to various embodiments, the lid 334 may be configured to protect the membrane film during device fabrication, wafer dicing (e.g., singulation) and/or packaging. The lid 334 may have other configurations and/or may be composed of other suitable materials in other embodiments.

Figure 5:
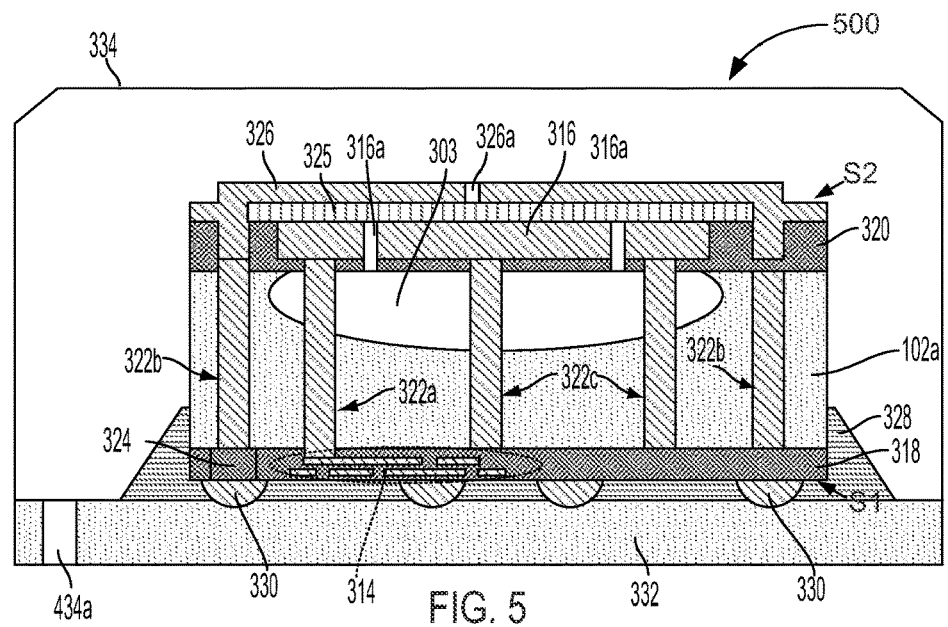
FIG. 5 schematically illustrates a cross-section side view of another microphone assembly, in accordance with some embodiments.

FIG. 5 schematically illustrates a cross-section side view of another microphone assembly 500, in accordance with some embodiments. The microphone assembly 500 may comport with embodiments described in connection with the microphone assembly 400 except that the microphone assembly 500 in FIG. 5 does not include one or more openings 334a to provide a sound port; rather the package substrate 332 includes one or more openings 434a formed through the package substrate 332 to provide a sound port of the microphone assembly 500. In some embodiments, the package substrate 332 is a flip-chip substrate and the semiconductor substrate 102a is part of a die that is coupled with the flip-chip substrate in a flip-chip configuration. The one or more openings 434a may provide access for ambient gas (e.g., air) to enter the region enclosed by the lid 334, as can be seen. In some embodiments, the one or more openings 434a may be ducts for ventilation of ultrasonic waves. In some embodiments, a bottom port (e.g., one or more openings 434a) may be suitable for mobile phone devices.

Figure 6:
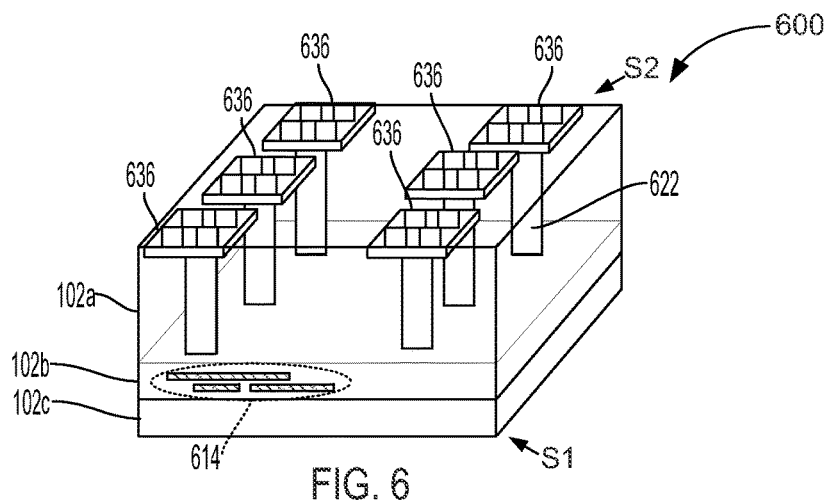
FIG. 6 schematically illustrates a perspective view of a microphone assembly according to a first configuration, in accordance with some embodiments.

FIG. 6 schematically illustrates a perspective view of a microphone assembly 600 according to a first configuration, in accordance with some embodiments. In the first configuration, a single die embodiment is depicted where active circuitry 614 such as, for example, amplifier, bias circuitry, phase shifter, delay-sum beam forming circuitry, sigma delta modulator, phase shift delay (Td), and/or power generation and regulation elements or other components of receiver circuitry are disposed in device layer 102b on a first side S1 of a die and microphone components 636 such as, for example, membrane film and/or back-plate of one or more MEMS microphone transducers are disposed on a second side S2 of the die. For example, the microphone assembly may be a single chip integrated MEMS microphone SoC.

The microphone components 636 may include membrane films exposed to the air to allow detection of acoustic waves (e.g., in a broadside configuration). In some embodiments, each of the depicted microphone components 636 may represent a discrete microphone device of an array of microphone devices. The first configuration of the microphone assembly 600 may allow flip-chip coupling of the first side S1 of the die (e.g., by way of die-interconnect structures coupled with interconnect layer 102c) with another die or package assembly such as a package substrate and the microphone components 636 on the second side S2 can be directly exposed to an external sound front.

Placing the membrane film on the backside of the die (e.g., the second side S2) may allow positioning of the die (e.g., on top of a stack of dies) such that the membrane film is exposed to incoming wave fronts when the die is flip-chip mounted on another die or substrate. Such configuration may allow flip-chip mounting of the die to better expose the membrane film to sound waves in contrast to wire-bonding for dies having microphone components on an active side of the die. Using flip-chip configurations may facilitate application of the microphone assembly 600 in implementations where a smaller footprint is an important factor such as, for example, in smaller devices such as mobile phones or wearable devices. Placement of the microphone components 636 on the backside (e.g., second side S2) may allow for a reduced die size (e.g., about 50% reduction in size) relative to placement of microphone components 636 on the frontside (e.g., the first side S1) with active circuitry 614. Placement of the membrane film on the backside of the die may further free up the frontside (e.g., the first side S1) of the die for more active devices such as active circuitry 614 while still providing a short distance between the membrane film and the active circuitry 614. Further, the active circuitry 614 may be shielded from the environment in a flip-chip configuration. In some embodiments, the microphone components 636 may be fabricated subsequent to active circuitry 614 and, thus, may not affect the processing of the active circuitry.

According to various embodiments, one or more TSVs 622 corresponding with the microphone components 636 may be formed through the semiconductor substrate 102a, as can be seen. In some embodiments, the active circuitry 614 may be coupled with the microphone components 636 using the one or more TSVs 622 that are configured to route electrical signals through the semiconductor substrate 102a.

Figure 7:
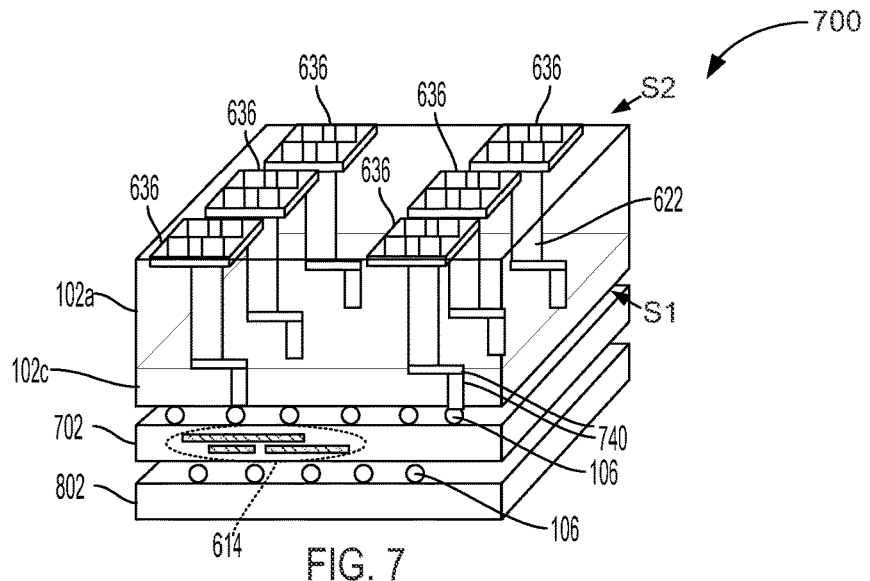
FIG. 7 schematically illustrates a perspective view of a microphone assembly according to a second configuration, in accordance with some embodiments.

FIG. 7 schematically illustrates a perspective view of a microphone assembly 700 according to a second configuration, in accordance with some embodiments. In the second configuration, a multi-die embodiment is depicted where active circuitry 614 is disposed on a die (e.g., die 702 in the depicted example) that is electrically coupled with the die on which the microphone components 636 are formed. For example, the die having the microphone components 636 may be coupled with die 702 using die-level interconnect structures 106 to route electrical signals between the active circuitry 614 and the microphone components 636. One or more interconnect structures (e.g., vias and/or trenches) 740 may be formed in an interconnect layer 102c to route electrical signals between the active circuitry 614 of die 702 and the second side S2 of the die having the microphone components 636. For example, the one or more interconnect structures 740 may be coupled with the one or more TSVs 622 to provide routing for test and/or reference signals used for testing (such as electronics testing by probing) the microphone assembly 700. In some embodiments, the second configuration may allow probing of the transducer (e.g., reference plane probing) on the second side S2.

In some embodiments, the die 702 may be further coupled with another die 802. For example, the die 702 may have an active side (e.g., including active devices) that is directly coupled to the first side S1 of the die having the microphone components 636 and an inactive side that is coupled with the other die 802 using die-level interconnect structures 106. The die 702 may include one or more TSVs configured to route electrical signals between the die 702 and the other die 802. In one embodiment, the die 702 may be a system-on-chip including active circuitry 614 for use in connection with the microphone components 636 and the die 802 may be memory or logic (e.g., processor). In other embodiments, the die 802 or combinations of dies (e.g., die 702 and die 802) may include the active circuitry 614. In still other embodiments, the microphone components 636 may be electrically coupled with active circuitry 614 on another die using other suitable techniques such as, for example, wire-bonding, or other interposer configurations.

Figure 8:
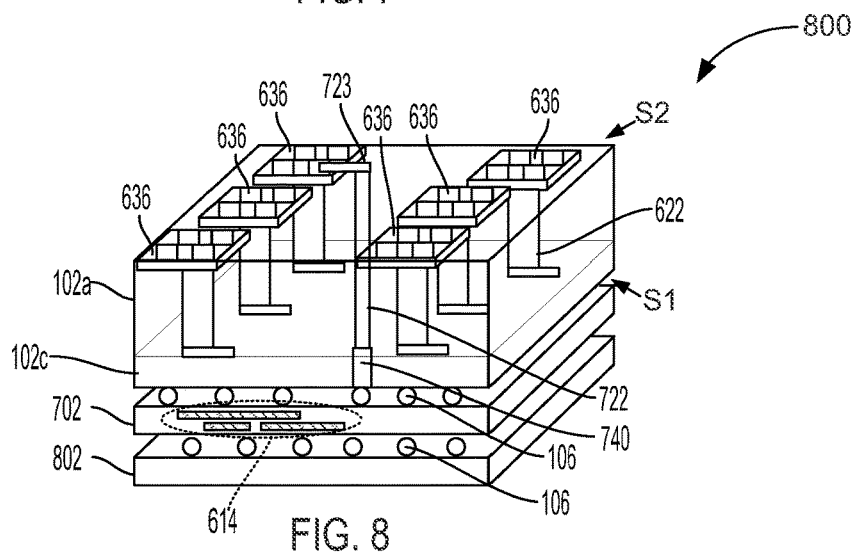
FIG. 8 schematically illustrates a perspective view of a microphone assembly according to a third configuration, in accordance with some embodiments.

FIG. 8 schematically illustrates a perspective view of a microphone assembly 800 according to a third configuration, in accordance with some embodiments. In the third configuration, another multi-die embodiment is depicted where active circuitry 614 is disposed on a die (e.g., die 702 in the depicted example) that is electrically coupled with the die on which the microphone components 636 are formed. The microphone assembly 800 may comport with embodiments described in connection with the microphone assembly 700 except that the microphone assembly 800 of FIG. 8 may allow probing of the transducer (e.g., reference plane probing) on the first side S1. For example, in some embodiments, one or more signaling TSVs 722, interconnect structures 740 and/or redistribution layer (RDL) features 723 may be formed to allow probing of the membrane film from the first side S1 through the one or more signaling TSVs 722.

Figure 9:
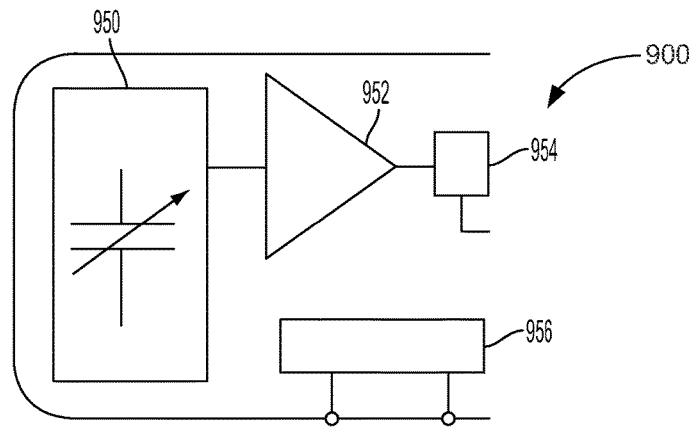
FIG. 9 schematically illustrates example receiver circuitry of a microphone device, in accordance with some embodiments.

FIG. 9 schematically illustrates example receiver circuitry 900 of a microphone device (e.g., microphone device 104 of FIG. 1), in accordance with some embodiments. The receiver circuitry 900 may represent a receiver circuit of a microphone output. According to various embodiments, the receiver circuitry 900 may include a TSV-MEMS transducer 950 (e.g., capacitive transducer assembly 300 of FIG. 3) coupled with an amplifier 952 and phase shift delay 954, as can be seen. In some embodiments, a tone signal of an individual microphone may be converted to a digital stream by phase shift delay 954. The receiver circuitry 900 may further include a power generator block 956, which may include an on-die high voltage bias generator for the TSV-MEMS transducer 950 (charge pump circuit) and silent power regulators for the pre-amplifier 952. In some embodiments, the circuitry 314 or active circuitry 614 described herein may include the receiver circuitry 900 of FIG. 9.

Figure 10:
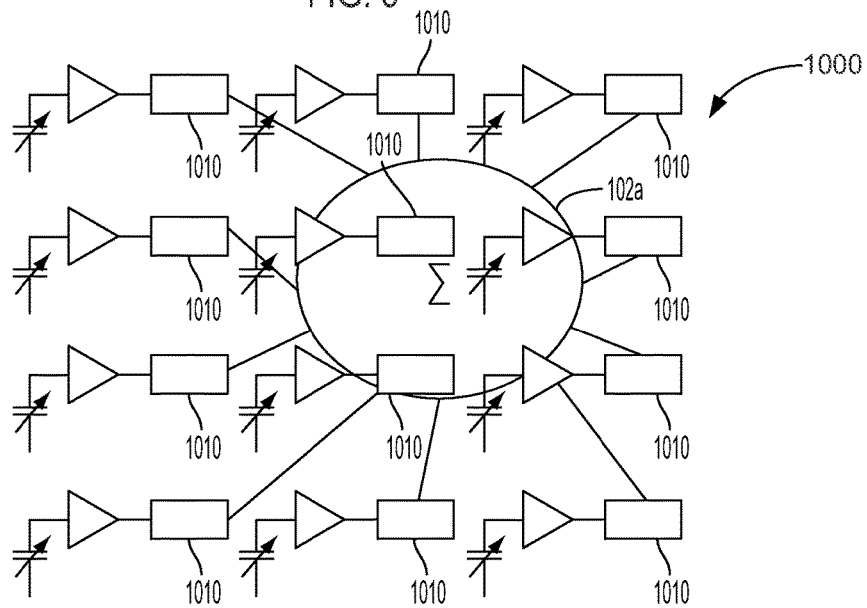
FIG. 10 schematically illustrates an example of phase array analog processing of output data including summation of delayed signals, in accordance with some embodiments.

FIG. 10 schematically illustrates an example methodology 1000 of phase array analog processing of output data including summation of delayed signals, in accordance with some embodiments. The signal processing methodology 1000 of a microphone array may be performed by delay sum beam forming, in some embodiments. The phase array may be configured in a focused 'beam-like' sensitivity pattern. For example, a microphone acoustic beam polar pattern (directionality) such as, for example, omnidirectional, (hyper-) cardioid together with a lobe direction may be controlled electronically. In some embodiments, receiver circuitry (e.g., receiver circuitry 900 of FIG. 9) of each individual microphone may feed an output tone signal into a steering delay stage block 1010 (e.g., a filter) where a programmable delay may be introduced into the tone signal. The example 1000 may include an array of variable capacitors (e.g., capacitive transducer assembly 300 of FIG. 3 or TSV-MEMS transducer 950 of FIG. 9) and amplifiers (e.g., amplifier 952 of FIG. 9) disposed on a common semiconductor substrate 102a and configured to process output data of discrete microphone devices.

Figure 11:
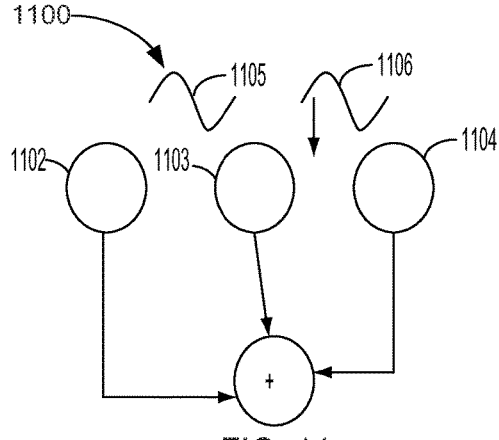
FIG. 11 schematically illustrates an example broadside configuration of phase array microphones, in accordance with some embodiments.

FIG. 11 schematically illustrates an example broadside configuration 1100 of phase array microphones, in accordance with some embodiments. In the broadside configuration 1100, the microphone devices (e.g., microphone devices 1102, 1103, 1104) may be configured in a broadside pattern such that incident sound waves (sound waves 1105, 1106) are perpendicular to a line of the microphone devices, as can be seen. Individual outputs from the microphone devices (e.g., microphone devices 1102, 1103, 1104) may be summed together, as can be seen. In FIG. 10, a programmable delay may be introduced into the tone signal. In some embodiments, subsequently in FIG. 11, the delayed tone signals of each individual microphone device (e.g., microphone devices 1102, 1103, 1104) may be summed together applying programmable weighting coefficients. The described signal processing may be performed by digital signal processing on the microphone array die. In other embodiments, because of their small size form factor, multiple microphone arrays may be configured in an end-fire configuration. The microphone devices may be configured in other suitable ways in other embodiments.

Figure 12:
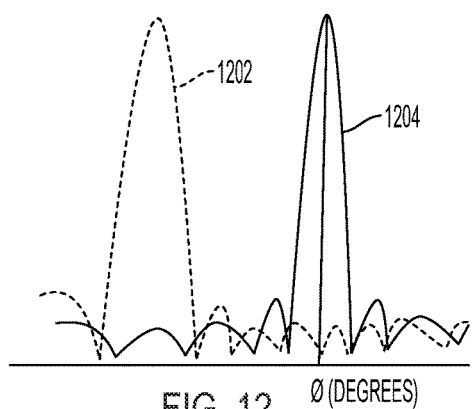
FIG. 12 schematically illustrates an example steered beam using a phase array microphone, in accordance with some embodiments.

FIG. 12 schematically illustrates an example steered beam using a phase array microphone, in accordance with some embodiments. A steered beam pattern 1202 is depicted together with an unsteered beam pattern 1204. A peak of the unsteered pattern 1204 is centered at 0 degrees and the steered beam pattern 1202 is shifted relative to the steered pattern 1202. The steered beam pattern 1202 may be steered towards a noise source for better noise cancellation. In some embodiments, all phase array beamforming circuitry may be disposed on a single die that also contains the phase array microphones.

Figure 13:
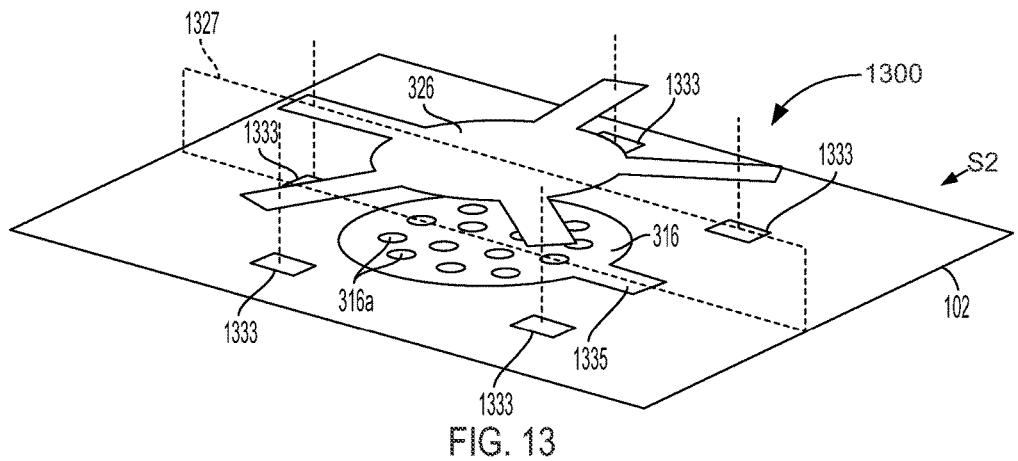
FIG. 13 schematically illustrates a perspective view of an example layout of a microphone back-plate and membrane film, in accordance with some embodiments.

FIG. 13 schematically illustrates an exploded perspective view of an example layout 1300 of a microphone back-plate 316 and membrane film 326, in accordance with some embodiments. According to various embodiments, the membrane film 326 may include multiple extended structures ("legs") that are connected to the backside (e.g., second side S2) of a die 102 to suspend the membrane film 326 over the back-plate 316. For example, as can be seen in the depicted embodiment, the membrane film 326 includes five legs that are physically and electrically coupled with corresponding RDL pads 1333, which may be electrically and, in some embodiments, physically coupled with one or more TSVs (e.g., ground TSVs 322b of FIG. 4). The physical and electrical coupling between the RDL pads 1333 and the legs of the membrane film 326 are represented by dashed vertical lines to avoid obscuring aspects of the invention, but may be accomplished using vias or any other suitable interconnect structure. In some embodiments, each of the RDL pads 1333 may be electrically coupled with a corresponding ground TSV (e.g., ground TSVs 322b of FIG. 4).

The back-plate 316 may include one or more openings 316a to provide air holes into an underlying chamber (e.g., chamber 303 of FIG. 4). In some embodiments, an RDL pad 1335 may be physically and electrically coupled with the back-plate 316. The RDL pad 1335 may be electrically and, in some embodiments, physically coupled with an underlying TSV such as a signal TSV (e.g., signal TSV 322a of FIG. 4).

The membrane film 326 may include more or fewer legs than depicted and/or may be configured relative to the back-plate 316 in other suitable configurations in other embodiments. Cross-section area 1327 may represent a portion of a cross-section area used in connection with description of FIGS. 14a-o.

Figure 14A:
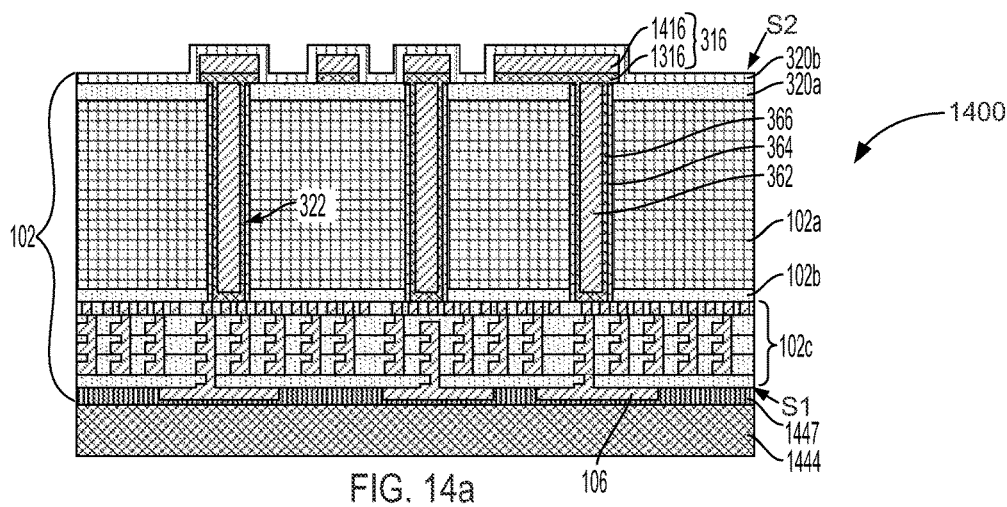
FIGS. 14a-o schematically illustrate a cross-section side view of a microphone assembly during various stages of fabrication, in accordance with some embodiments.
Figure 14B:
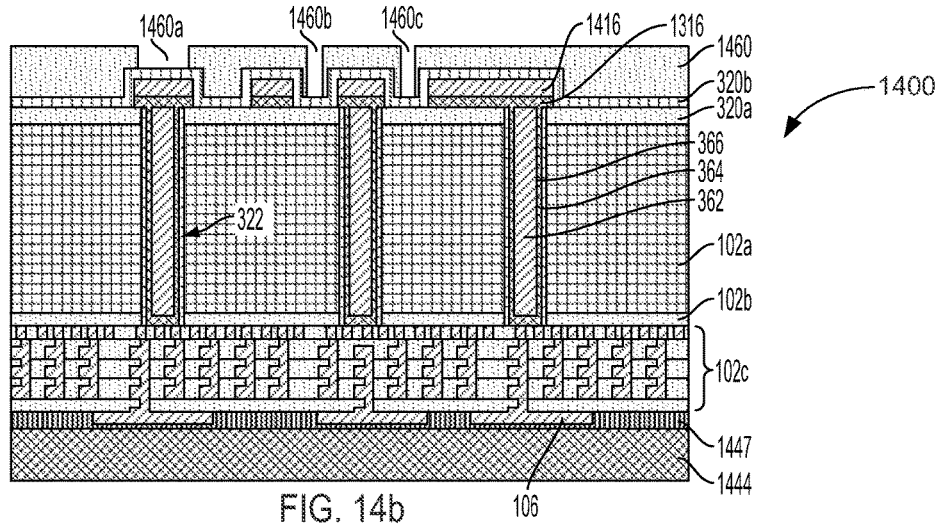
Figure 14C:
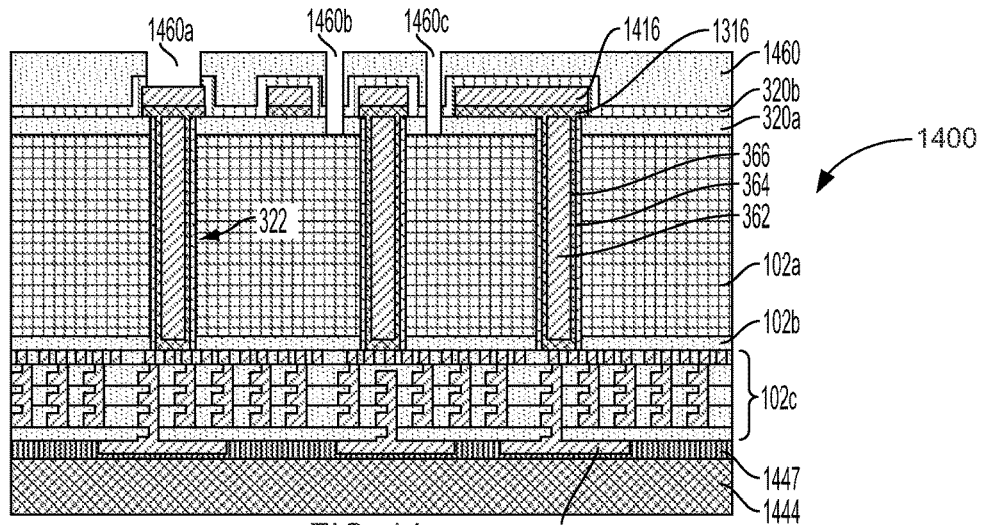
Figure 14D:
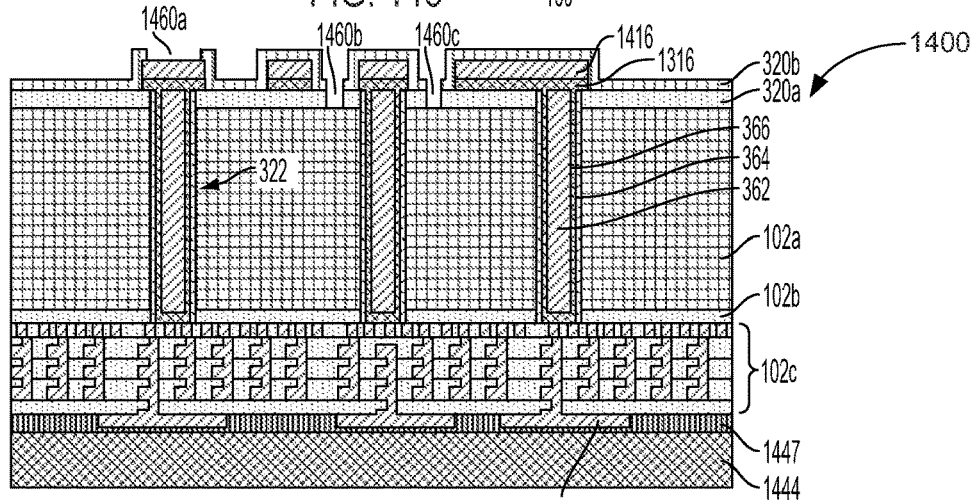
Figure 14E:
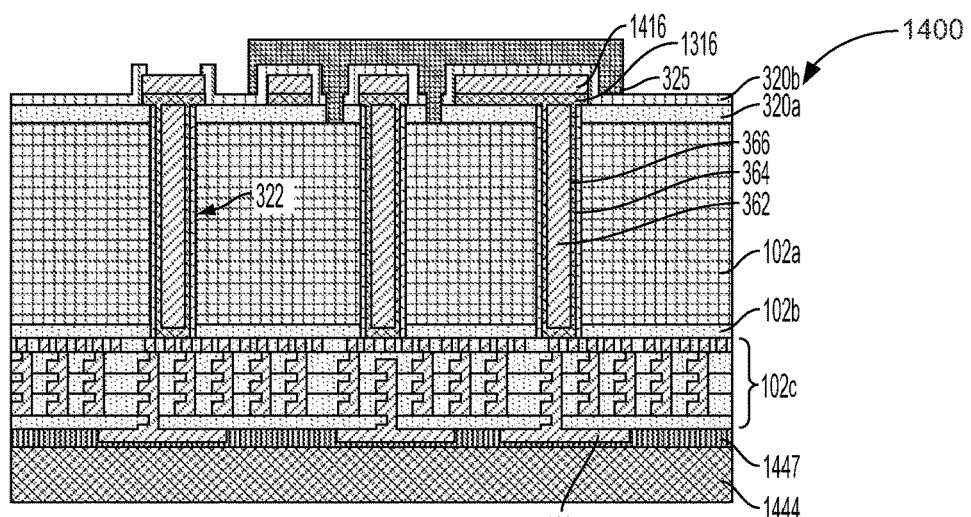
Figure 14F:
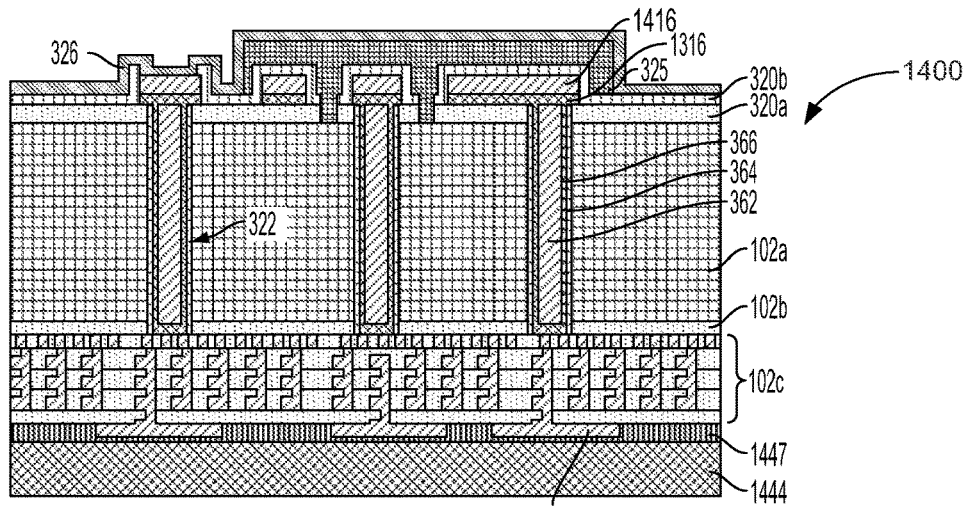
Figure 14G:
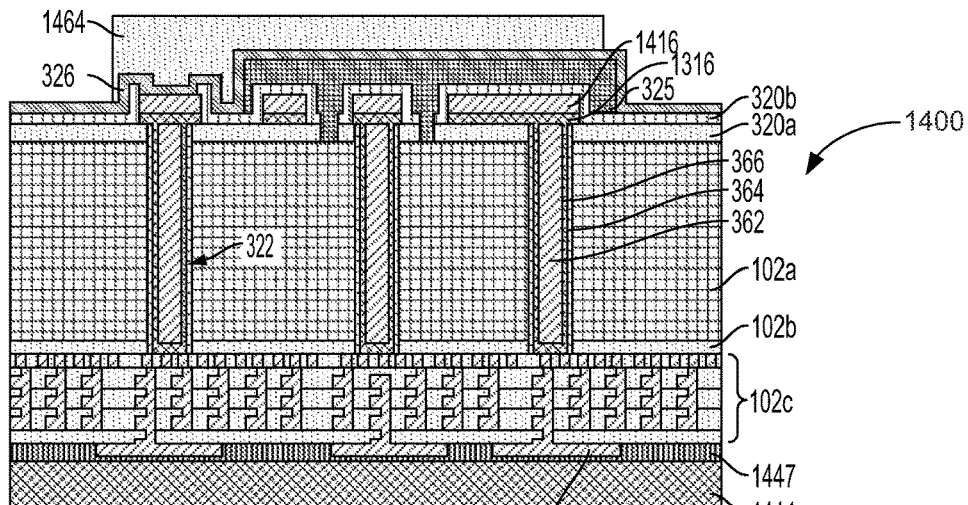
Figure 14H:
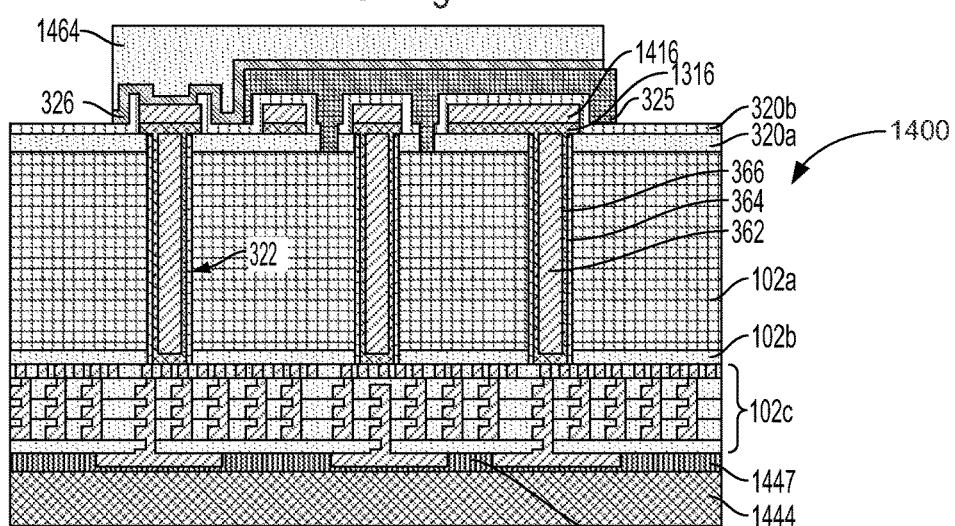
Figure 14I:
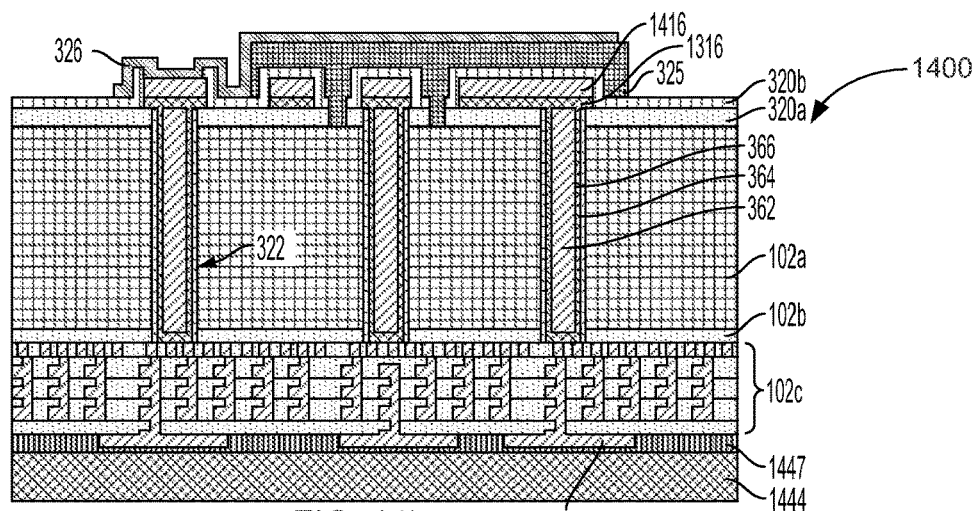
Figure 14J:
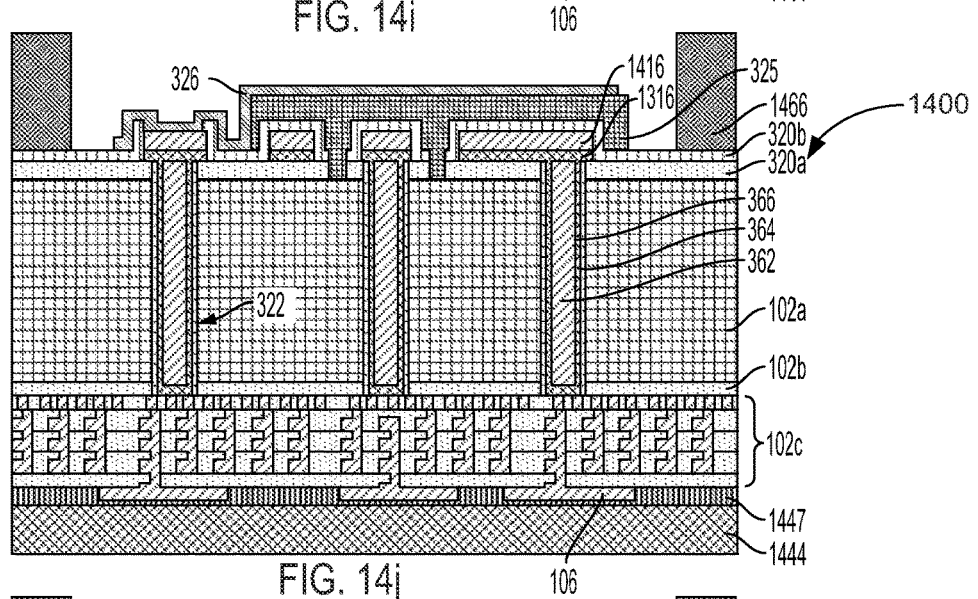
Figure 14K:
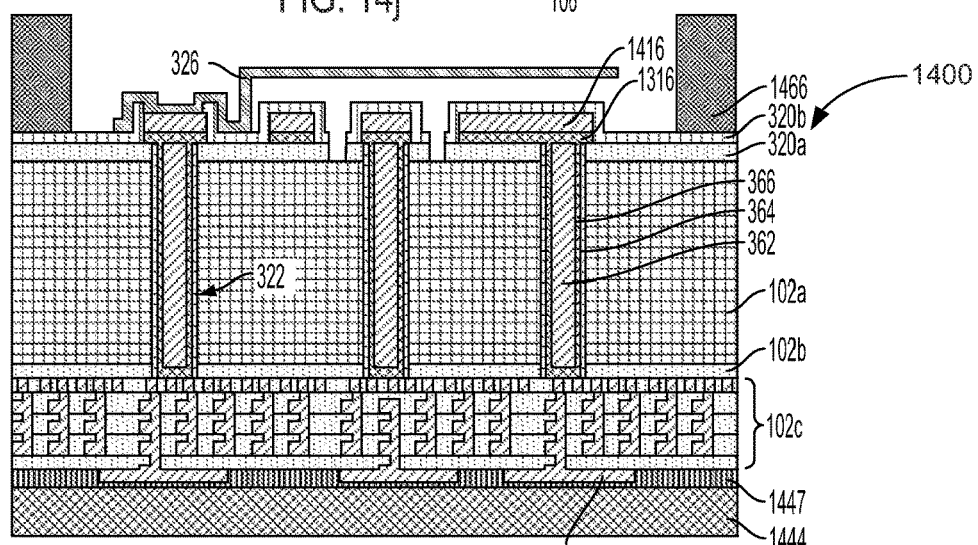
Figure 14L:
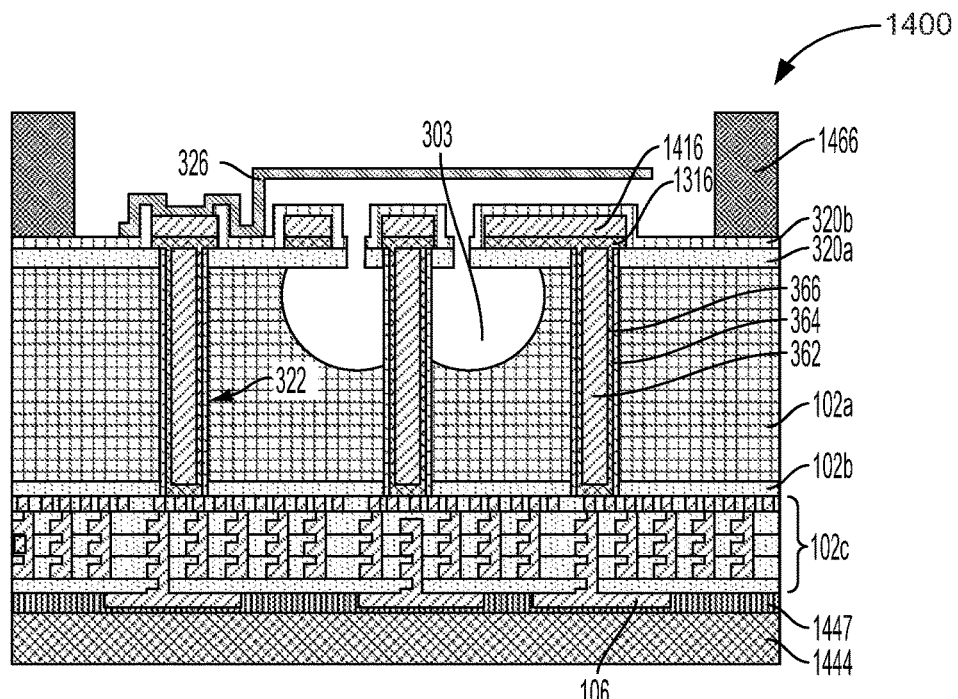
Figure 14M:
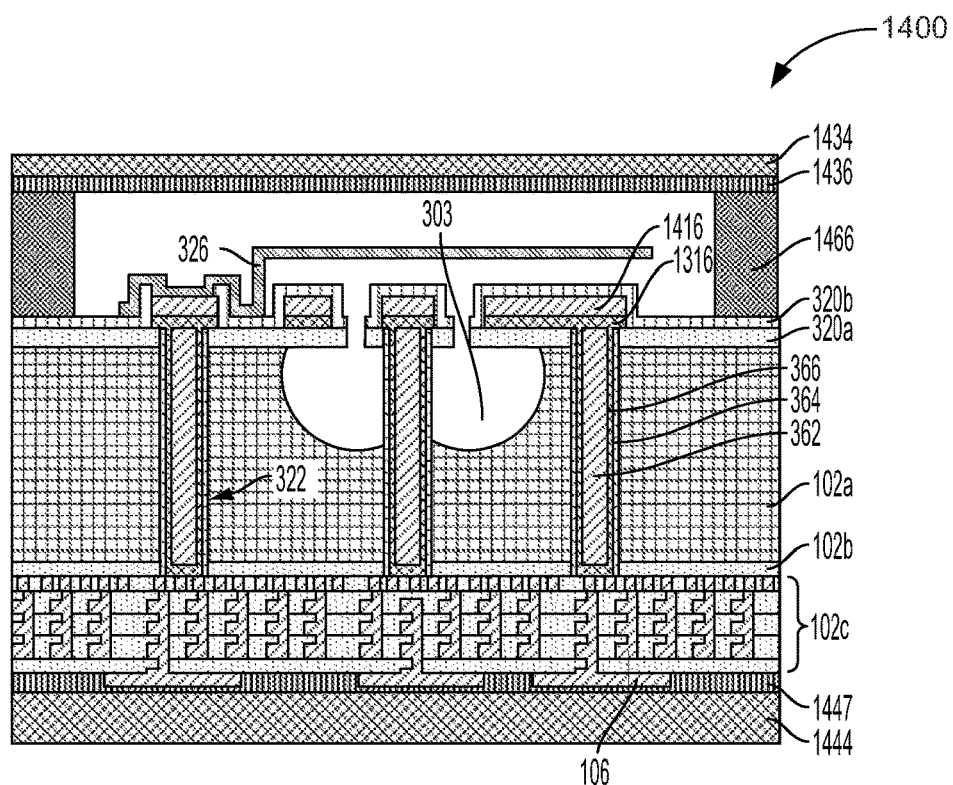
Figure 14N:
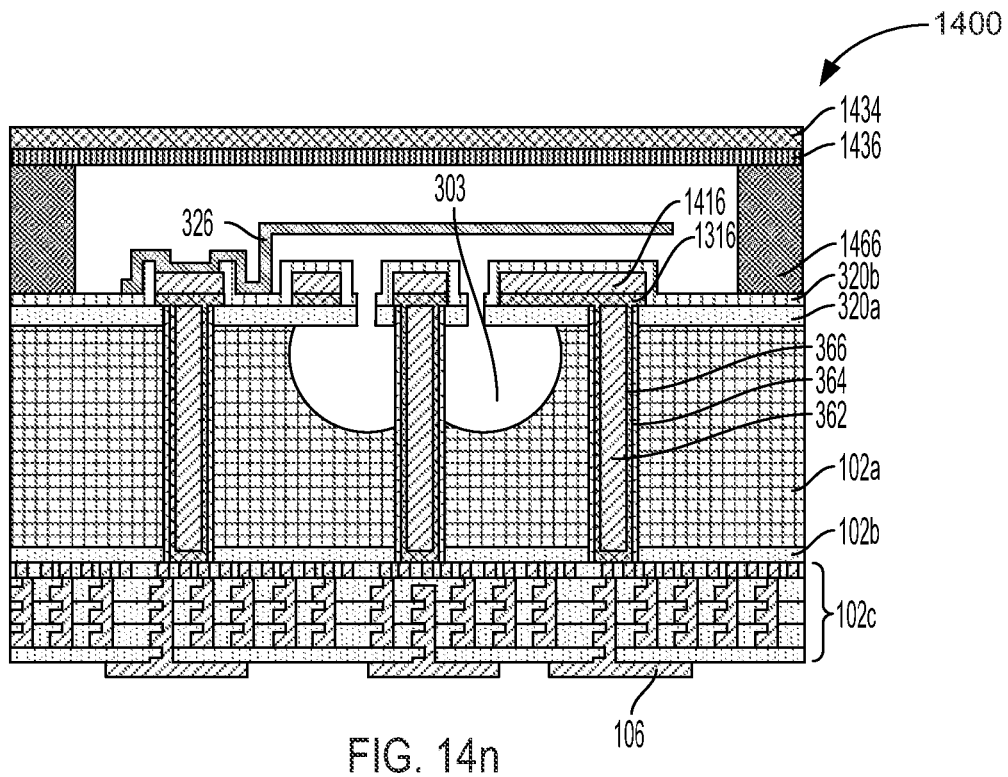
Figure 14O:
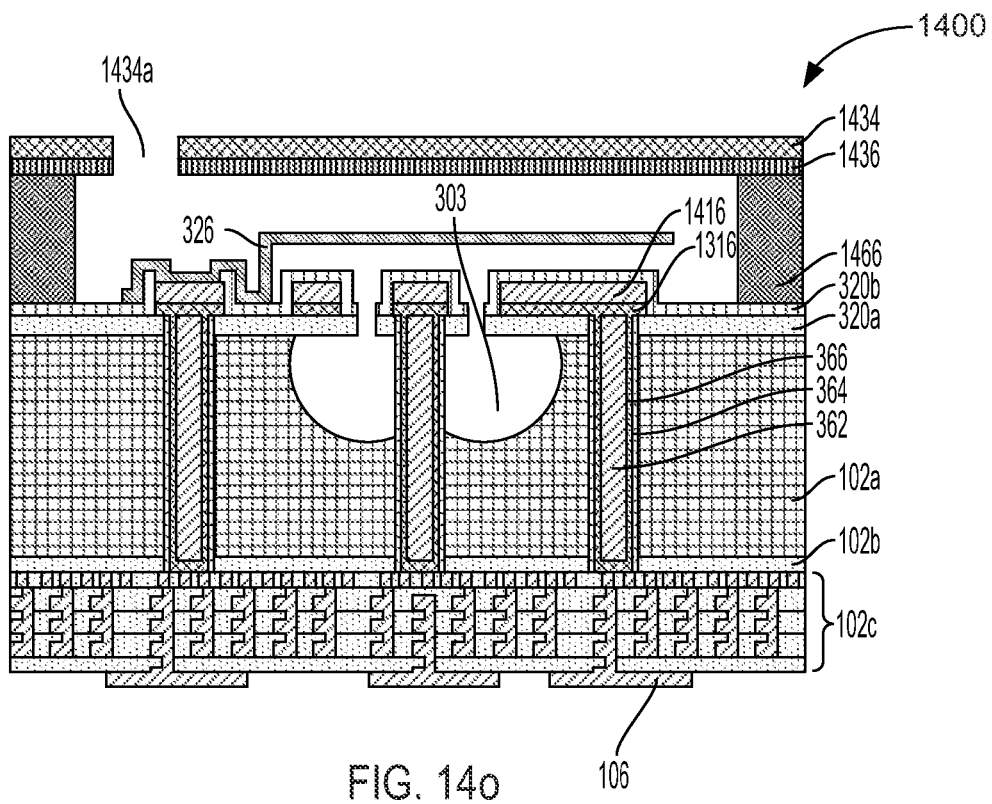

FIGS. 14a-o schematically illustrate a cross-section side view of a microphone assembly 1400 during various stages of fabrication, in accordance with some embodiments. The cross-section side view of FIGS. 14a-o may include the cross-section area 1327 of FIG. 13 in some embodiments.

Referring to FIG. 14a, the microphone assembly 1400 is depicted subsequent to forming circuitry (e.g., device layer 102b and/or interconnect layer 102c) on a first side S1 of a die 102, forming through-silicon vias (TSVs) 322 through a semiconductor substrate 102a of the die 102, and forming a back-plate 316 of a microphone device on a second side S2 of the die 102. In some embodiments, the TSVs 322 may be formed subsequent to forming the circuitry and forming the back-plate 316 may be performed subsequent to forming the TSVs. The second side S2 of the die may be thinned or recessed to provide a die 102 having a smaller thickness prior to forming the TSVs. The actions may be performed in other suitable orders in other embodiments.

The die 102 may be coupled with a temporary carrier assembly such as carrier wafer 1444 using any suitable technique including, for example, an adhesive 1447 that is configured to form a temporary bond between the carrier wafer 1444 and the die 102. The carrier wafer 1444 may be used to facilitate handling of the die 102 during fabrication on the second side S2 of the die 102.

The die 102 may include die-level interconnect structures 106 coupled with circuitry of interconnect layer 102c and configured to route electrical signals between the die 102 and other components to be coupled with the die 102. The interconnect layer 102c may include multiple layers of interconnect structures (e.g., trenches and/or vias) that are configured to route the electrical signals between the device layer 102b and the die-level interconnect structures 106. The device layer 102b may include active devices such as transistors or other components of circuitry for use in connection with operation of a microphone device.

The TSVs 322 may be formed through the semiconductor substrate 102a and at least some of the TSVs 322 may be electrically coupled with the device layer 102b and/or interconnect layer 102c to route the electrical signals between the device layer 102b or interconnect layer 102c and components of the microphone device on the second side S2 of the die 102. In some embodiments, individual TSVs of the TSVs 322 may include a barrier and/or seed layer 366, an insulating layer 364 (e.g., an oxide) and a metal fill portion 362, coupled as can be seen.

One or more passivation layers may be formed to protect underlying components from exposure to water, oxygen or other contaminants. In some embodiments, a passivation layer 320a may be formed on the semiconductor substrate 102a on the second side S2 of the die 102. In some embodiments, the passivation layer 320a may be deposited prior to forming the TSVs 322 through the second side S2 of the die 102. The passivation layer 320a may be composed of any of a wide variety of suitable materials including, for example, silicon nitride (SiN) or silicon carbide (SiC).

The back-plate 316 may be formed on the passivation layer 320a and the TSVs 322. In some embodiments, the back-plate 316 may be composed of a barrier and/or seed layer 1316 and a metal 1416 such as, for example, copper disposed on the barrier and/or seed layer 1316. The back-plate 316 may be formed using conventional techniques for fabricating a redistribution layer (RDL). In some embodiments, a passivation layer 320b may be formed on the back-plate 316 and the passivation layer 320a, as can be seen. The passivation layer 320b may be composed of similar materials as described for passivation layer 320a.

Referring to FIG. 14b, the microphone assembly 1400 is depicted subsequent to depositing a photosensitive material 1460 such as, for example, photoresist to coat the second side S2, as can be seen. The photosensitive material 1460 may be patterned using, for example, lithography processes (e.g., exposure/develop) to form openings (e.g., openings 1460a, 1460b, 1460c) in the photosensitive material 1460. For example, one or more openings 1460a may be formed over one or more portions of the back-plate 316 that are to be electrically and physically coupled with a film membrane and one or more openings 1460b, 1460c may be formed over regions where openings in the passivation layers 320a, 320b are desired (e.g., for air holes).

Referring to FIG. 14c, the microphone assembly 1400 is depicted subsequent to etching the patterned photosensitive material 1460 to extend the openings 1460a, 1460b, 1460c through the passivation layer(s) 320a, 320b, as can be seen. The etching process may expose underlying metal 1416 of the back-plate 316 or semiconductor material of the semiconductor substrate 102a. In some embodiments, the etching process may include a dry etch such as, for example, plasma etch. The etching process may include other suitable techniques in other embodiments.

Referring to FIG. 14d, the microphone assembly 1400 is depicted subsequent to removing the photosensitive material 1460. The photosensitive material 1460 may be removed, for example, using any suitable resist strip and/or cleaning process.

Referring to FIG. 14e, the microphone assembly 1400 is depicted subsequent to depositing and patterning a sacrificial material 325 on the second side S2 of the die 102. The sacrificial material 325 may be patterned such that the sacrificial material 325 is configured to provide structural scaffolding and/or mold for the formation of a film membrane on the sacrificial material 325. For example, in some embodiments, the sacrificial material 325 may be formed to fill the openings 1460b and 1460c while leaving opening 1460a exposed. In some embodiments, the sacrificial material 325 may be formed at a temperature that is less than a processing temperature used in connection with debonding the adhesive 1447, which may range from about 175 degrees Celsius to about 200 degrees Celsius. The sacrificial material 325 may include any suitable material including, for example, polypropylene carbonate-based materials, photoresists, buffer coat materials and the like.

Referring to FIG. 14f, the microphone assembly 1400 is depicted subsequent to depositing a membrane film 326 on the second side S2 of the die 102, as can be seen. The membrane film 326 may include one or more layers that are deposited using any suitable technique including, for example, physical vapor deposition (PVD), chemical vapor deposition (CVD), plasma-enhanced CVD, and/or atomic layer deposition (ALD). In some embodiments, the membrane film 326 may include a stack of layers (not shown) including an adhesion layer disposed on the passivation layer 320b, the sacrificial material 325, and the metal 1416 of the back-plate 316, a membrane metal layer disposed on the adhesion layer and a capping layer disposed on the membrane metal layer. In one embodiment, the adhesion layer includes titanium nitride (TiN), the membrane metal layer includes aluminum (Al), and the capping layer includes TiN. Aluminum may have compatible etch selectivity to downstream etch processes (e.g., $XeF_2$) that may be used. The membrane film 326 may include other suitable materials in other embodiments. For example, the membrane metal layer may be composed of copper or gold in other embodiments.

Referring to FIG. 14g, the microphone assembly 1400 is depicted subsequent to depositing and patterning a photosensitive material 1464 on the membrane film 326. For example, the photosensitive material 1464 may be exposed and developed to provide openings over the membrane film 326 where removal of the membrane film 326 is desired.

Referring to FIG. 14h, the microphone assembly 1400 is depicted subsequent to removing the unprotected portions of the membrane film 326 by etching. The etching process may include, for example, wet or dry etch techniques. In one embodiment where the membrane film 326 includes a stack of TiN/Al/TiN, a chlorine-based dry etch process may be used.

Referring to FIG. 14i, the microphone assembly 1400 is depicted subsequent to removing the photosensitive material 1464. The photosensitive material 1464 may be removed, for example, using any suitable resist strip and/or cleaning process.

Referring to FIG. 14j, the microphone assembly 1400 is depicted subsequent to depositing and patterning a cavity layer 1466. In some embodiments, the cavity layer 1466 may be composed of a polymer such as an epoxy-based material or other suitable material. The polymer may be thick, photodefinable and permanent, in some embodiments. Material of the cavity layer 1466 may be deposited using any suitable technique to coat the second side S2 of the die 102 including, for example, spin-on processes and the like. A cavity may be formed in the cavity layer 1466 over the back-plate 316 and membrane film 326 such that the cavity layer 1466 forms a perimeter to partially house the back-plate 316 and membrane film 326, as can be seen. In some embodiments, the cavity may be formed by patterning (e.g., expose/develop). A cure process may be performed on the deposited material of the cavity layer 1466 in some embodiments.

Referring to FIG. 14k, the microphone assembly 1400 is depicted subsequent to removing the sacrificial material 325. The sacrificial material 325 may be removed using any suitable technique including, for example, thermal decomposition or wet/dry etch techniques. Air may fill the gap formed by removal of the sacrificial material 325.

Referring to FIG. 14l, the microphone assembly 1400 is depicted subsequent to forming a chamber 303 in the semiconductor substrate 102a. According to various embodiments, the chamber 303 may be formed by an etch process through openings in the passivation layers 320a, 320b. For example, in one embodiment, a xenon difluoride ($XeF_2$) plasma etch may be used to isotropically etch silicon of the semiconductor substrate 102a in the gas phase at about room temperature with high selectivity to numerous materials including silicon dioxide, silicon nitride, titanium nitride, aluminum, copper, gold, and many polymers. Etching of the semiconductor substrate 102a to form the chamber 303 may be performed through the air vents (e.g., openings 316a of FIG. 4) that are formed through the passivation layers 320a, 320b. Other suitable etch processes and/or conditions may be used in other embodiments to form the chamber 303. In some embodiments, one or more of the TSVs 322 may be configured to provide a support pillar for the back-plate 316 in a region of the chamber 303, as can be seen.

Referring to FIG. 14m, the microphone assembly 1400 is depicted subsequent to covering and/or enclosing the membrane film 326 and back-plate 316 with a lid 1434. In some embodiments, the lid 1434 may include a lid wafer with an adhesive 1436 disposed on a surface to form a bond between the lid wafer and the cavity layer 1466 such that the lid 1434 and cavity layer 1466 form an enclosure around the membrane film 326 and back-plate 316, as can be seen.

The lid 1434 may be composed of any of a wide variety of suitable materials including, for example, silicon, stainless steel, polymer-based materials such as glass-reinforced epoxy or epoxy composites, or glass. The adhesive 1434 may be composed of any of a wide variety of suitable materials including, for example, underfill and/or molding compound materials.

A bond may be formed between the lid 1434 and the cavity layer 1466 using any suitable technique including, for example, a thermal cure to set the adhesive 1434a. The enclosure formed by the lid 1434 and cavity layer 1466 may protect the components of the microphone device from mechanical damage during subsequent handling and/or processing such as, for example, during a wafer debonding process.

Referring to FIG. 14n, the microphone assembly 1400 is depicted subsequent to detaching the die 102 with the encased microphone device from the temporary carrier (e.g., carrier wafer 1444 in the depicted embodiments). According to various embodiments, the carrier wafer 1444 is debonded from the die 102 using a thermal process to soften or breakdown the adhesive 1447. In some embodiments, the debonding process may include bringing opposing sides of the microphone assembly 1400 of FIG. 14m in thermal contact with robot blades and processing chucks. In such embodiments, the encased microphone device may be protected from damage during such handling by the lid 1434.

The lid 1434 may also protect the components of the microphone device during a singulation process of the die 102. For example, the die 102 may be mounted onto a mylar dicing frame with the microphone side of the wafer attached to an adhesive on the dicing frame for singulation. The lid 1434 may protect the microphone device when the singulated die is removed from the dicing frame and placed onto tape-and-reel.

Referring to FIG. 14o, the microphone assembly 1400 is depicted subsequent to forming an opening 1434a through the lid 1434 to provide a sound port hole for the microphone assembly 1400. The opening 1434a may be formed using any suitable technique including, for example, mechanical and/or laser drilling. In some embodiments, the opening 1434a may be formed subsequent to singulation and/or final packaging of the microphone assembly 1400 to reduce risk of damage to the membrane film 326 during such processing.

Figure 15:
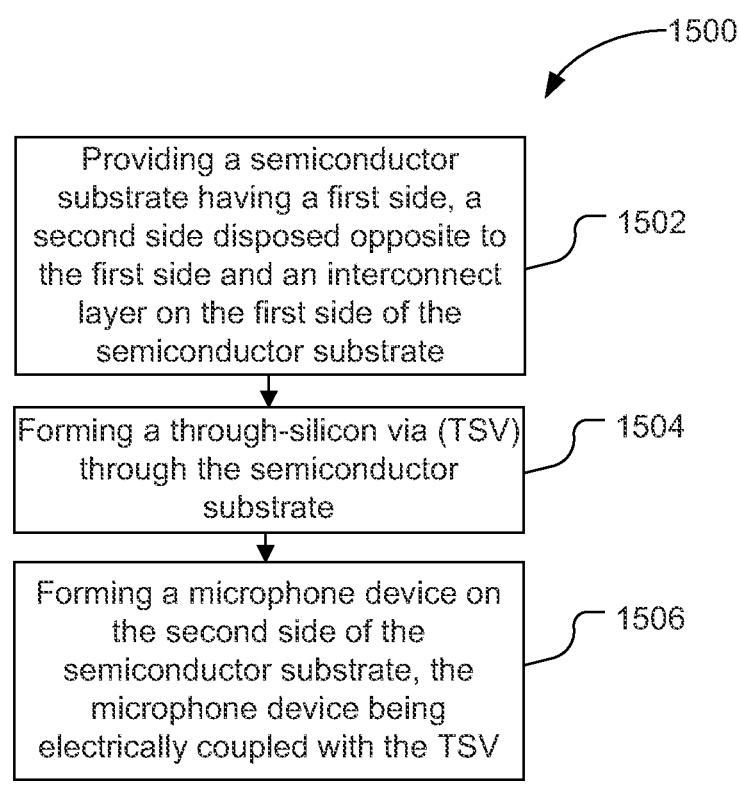
FIG. 15 schematically illustrates a flow diagram for a method of fabricating a microphone assembly, in accordance with some embodiments.

FIG. 15 schematically illustrates a flow diagram for a method 1500 of fabricating a microphone assembly (e.g., microphone assembly 400, 500, or 1400 of respective FIG. 4, 5 or 14o), in accordance with some embodiments. The method 1500 may comport with embodiments described in connection with FIGS. 1-4 and vice versa.

At 1502, the method 1500 may include providing a semiconductor substrate (e.g., semiconductor substrate 102a of FIG. 14a) having a first side (e.g., first side S1 of FIG. 14a), a second side (e.g., second side S2 of FIG. 14a) disposed opposite to the first side and an interconnect layer (e.g., interconnect layer 102c of FIG. 14a) on the first side of the semiconductor substrate. In some embodiments, the semiconductor substrate may further include a device layer (e.g., device layer 102b of FIG. 14a) disposed on the first side between the interconnect layer and the semiconductor substrate.

At 1504, the method 1500 may include forming a through-silicon via (TSV) (e.g., TSVs 322 of FIG. 14a or TSVs 322a, 322b, 322c of FIG. 4) through the semiconductor substrate. In some embodiments, the TSV may be formed through the second side of the semiconductor substrate subsequent to forming the interconnect layer and/or device layer. The TSV may be configured to route electrical signals between the first side of the semiconductor substrate where circuitry of active devices and/or interconnects are formed and the second side of the semiconductor substrate where components of a microphone device are to be formed. For example, in one embodiment, the TSV may be configured to route electrical signals between an active device of the device layer and the microphone device.

At 1506, the method 1500 may include forming a microphone device (e.g., microphone device 104 of FIG. 1) on the second side of the semiconductor substrate, the microphone device being electrically coupled with the TSV. In some embodiments, forming the microphone device may include forming a back-plate (e.g., back-plate 316 of FIG. 4 or FIG. 14o) on the second side of the semiconductor substrate. The back-plate may be electrically and/or physically coupled with the TSV. In some embodiments, forming the back-plate may include patterning a redistribution layer comprising a metal.

In some embodiments, forming the microphone device may further include forming a membrane film (e.g., membrane film 326 of FIG. 4 or FIG. 14o) over the back-plate to form a capacitor. In some embodiments, forming the membrane may include depositing a sacrificial material (e.g., sacrificial material 325 of FIG. 14e) on the back-plate, depositing material of the membrane film on the sacrificial material, and removing the sacrificial material.

In some embodiments, forming the microphone device may further include forming a chamber (e.g., chamber 303 of FIG. 4 or FIG. 14l) in the semiconductor substrate adjacent to or underlying the membrane film. The chamber may be formed in accordance with techniques described in connection with FIG. 14l.

In some embodiments, forming the microphone device may include covering components of the microphone device with a lid (e.g., lid 334 of FIG. 4 or lid 1434 of FIG. 14m). The semiconductor substrate may be coupled with a temporary carrier (e.g., carrier wafer 1444 of FIG. 14m) during at least part of a process of forming the microphone (e.g., actions described in connection with FIGS. 14a-m) and the semiconductor substrate may be decoupled from the temporary carrier subsequent to covering the microphone device with the lid.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 16:
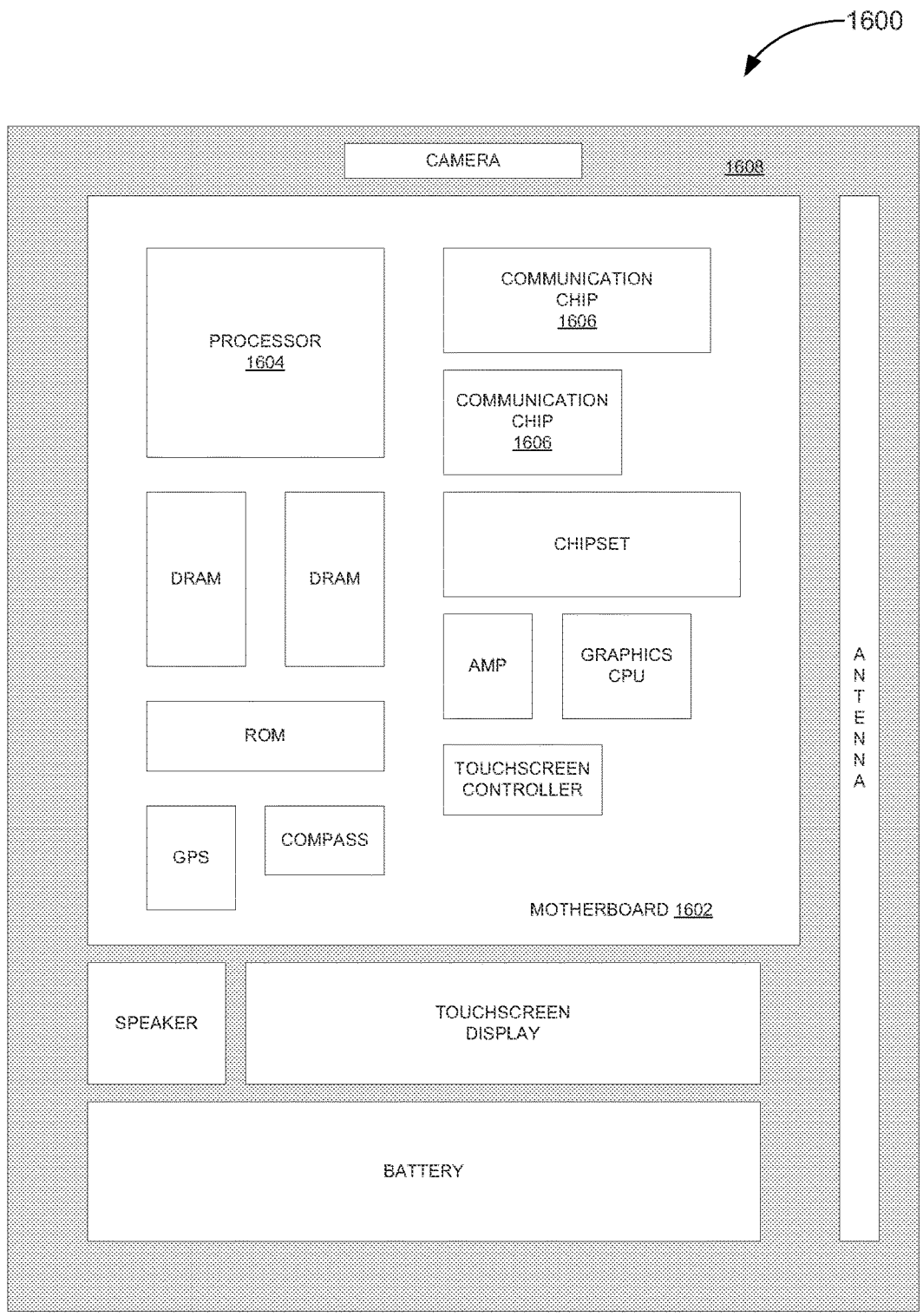
FIG. 16 schematically illustrates an example system that may include a microphone assembly as described herein, in accordance with some embodiments.

FIG. 16 schematically illustrates an example system (e.g., computing device 1600) that may include a microphone assembly (e.g., microphone assembly 400, 500 or 1400 of respective FIGS. 4, 5 and 14o) as described herein, in accordance with some embodiments. Components of the computing device 1600 may be housed in an enclosure (e.g., housing 1608). The motherboard 1602 may include a number of components, including but not limited to a processor 1604 and at least one communication chip 1606. The processor 1604 may be physically and electrically coupled to the motherboard 1602. In some implementations, the at least one communication chip 1606 may also be physically and electrically coupled to the motherboard 1602. In further implementations, the communication chip 1606 may be part of the processor 1604.

Depending on its applications, computing device 1600 may include other components that may or may not be physically and electrically coupled to the motherboard 1602. These other components may include, but are not limited to, a microphone device, volatile memory (e.g., dynamic random access memory (DRAM)), non-volatile memory (e.g., read only memory (ROM)), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1606 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1606 may operate in accordance with other wireless protocols in other embodiments.

The computing device 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, EV-DO, and others.

The processor 1604 of the computing device 1600 may include a microphone assembly (e.g., microphone assembly 400, 500 or 1400 of respective FIGS. 4, 5 and 14*o*) as described herein. For example, the die 102 of FIGS. 1-2 may be mounted on a package substrate (e.g., package substrate 121) that is mounted on a circuit board such as the motherboard 1602. The term "processor" may refer to any device or portion of a device that processes electronic data from registers and/or memory to transform that electronic data into other electronic data that may be stored in registers and/or memory.

The communication chip 1606 may also include a microphone assembly (e.g., microphone assembly 400, 500 or 1400 of respective FIGS. 4, 5 and 14*o*) as described herein. In further implementations, another component (e.g., SoC, ASIC, memory device or other integrated circuit device) housed within the computing device 1600 may include a microphone assembly (e.g., microphone assembly 400, 500 or 1400 of respective FIGS. 4, 5 and 14*o*) as described herein.

In various implementations, the computing device 1600 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1600 may be any other electronic device that processes data.

EXAMPLES

According to various embodiments, the present disclosure describes an apparatus. Example 1 of an apparatus may include a semiconductor substrate having a first side and a second side disposed opposite to the first side, an interconnect layer formed on the first side of the semiconductor substrate, a through-silicon via (TSV) formed through the semiconductor substrate and configured to route electrical signals between the first side of the semiconductor substrate and the second side of the semiconductor substrate, and a microphone device formed on the second side of the semiconductor substrate and electrically coupled with the TSV. Example 2 may include the apparatus of Example 1, further comprising a device layer formed on the first side of the semiconductor substrate, wherein the TSV is configured to route electrical signals between an active device of the device layer and the microphone device. Example 3 may include the apparatus of Example 2, wherein the TSV is a first TSV of a plurality of through-silicon vias (TSVs) and a second TSV of the plurality of TSVs is configured to structurally support the microphone device and is not configured to route electrical signals between the device layer and the microphone device. Example 4 may include the apparatus of Example 1, wherein the microphone device comprises a back-plate disposed on the second side of the semiconductor substrate and coupled with the TSV and a membrane film coupled with the back-plate to form a capacitor. Example 5 may include the apparatus of Example 4, wherein the microphone device further comprises a chamber formed in the semiconductor substrate adjacent to the membrane film. Example 6 may include the apparatus of Example 4, further comprising a lid configured to cover the microphone device. Example 7 may include the apparatus of Example 6, further comprising a passivation layer disposed on the second side of the semiconductor substrate, wherein the passivation layer is disposed between at least a portion of the back-plate and the semiconductor substrate and a cavity layer disposed on the passivation layer and having a cavity formed in the cavity layer, wherein the membrane film is disposed in the cavity and the lid is coupled with the cavity layer. Example 8 may include the apparatus of Example 6, wherein the lid includes a sound port hole. Example 9 may include the apparatus of Example 6, further comprising a flip-chip substrate including a sound port hole, wherein the semiconductor substrate is part of a die that is coupled with the flip-chip substrate in a flip-chip configuration, the lid is coupled with the flip-chip substrate to form a cavity, the die is disposed within the cavity, and the sound port hole provides access for sound to the cavity. Example 10 may include the apparatus of any of Examples 1-5, wherein the semiconductor substrate is part of a first die, the first die is coupled with a second die, and the second die includes receiver or sensor circuitry of the microphone device. Example 11 may include the apparatus of any of Examples 1-5, wherein the microphone device is one of a plurality of microphone devices formed on the second side of the semiconductor substrate.

According to various embodiments, the present disclosure describes a method. Example 12 of a method may include providing a semiconductor substrate having a first side, a second side disposed opposite to the first side, and an interconnect layer on the first side of the semiconductor substrate, forming a through-silicon via (TSV) through the semiconductor substrate, the TSV being configured to route electrical signals between the first side of the semiconductor substrate and the second side of the semiconductor substrate, and forming a microphone device on the second side of the semiconductor substrate, the microphone device being electrically coupled with the TSV. Example 13 may include the method of Example 12, wherein providing a semiconductor substrate further comprises providing a semiconductor substrate having a device layer formed on the first side of the semiconductor substrate, wherein the TSV is configured to route electrical signals between an active device of the device layer and the microphone device. Example 14 may include the method of Example 12, where forming the microphone device comprises, forming a back-plate on the second side of the semiconductor substrate, the back-plate being coupled with the TSV and forming a membrane film over the back-plate to form a capacitor. Example 15 may include the method of Example 14, wherein forming the membrane film comprises depositing a sacrificial material on the back-plate, depositing material of the membrane film on the sacrificial material, and removing the sacrificial material. Example 16 may include the method of Example 14, further comprising forming a chamber in the semiconductor substrate adjacent to the membrane film. Example 17 may include the method of Example 12, further comprising covering the microphone device with a lid. Example 18 may include the method of Example 17, wherein the semiconductor substrate is coupled with a temporary carrier during at least part of a process of forming the microphone device and the semiconductor substrate is decoupled from the temporary carrier subsequent to covering the microphone device with the lid.

According to various embodiments, the present disclosure describes a system (e.g., a computing device). Example 19 of a system may include a circuit board and a die electrically coupled with the circuit board, the die including a semiconductor substrate having a first side and a second side disposed opposite to the first side, an interconnect layer formed on the first side of the semiconductor substrate, a through-silicon via (TSV) formed through the semiconductor substrate and configured to route electrical signals between the first side of the semiconductor substrate and the second side of the semiconductor substrate and a microphone device formed on the second side of the semiconductor substrate and electrically coupled with the TSV. Example 20 may include the computing device of Example 19, wherein the die is coupled with a package substrate and the package substrate is coupled with the circuit board. Example 21 may include the computing device of any of Examples 19, wherein the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a semiconductor substrate having a first side and a second side opposite to the first side;
an interconnect layer on the first side of the semiconductor substrate;
a first through-silicon via (TSV) through the semiconductor substrate, the first TSV to route electrical signals between the first side of the semiconductor substrate and the second side of the semiconductor substrate;
a microphone device on the second side of the semiconductor substrate and electrically coupled with the first TSV;
a device layer on the first side of the semiconductor substrate, wherein the first TSV is to route electrical signals between an active device of the device layer and the microphone device; and
a second TSV to structurally support the microphone device, wherein the second TSV is not to route electrical signals between the device layer and the microphone device.

2. The apparatus of claim 1, wherein the microphone device comprises:
a back-plate on the second side of the semiconductor substrate and coupled with the first TSV; and
a membrane film coupled with the back-plate to form a capacitor.

3. The apparatus of claim 2, wherein the microphone device further comprises:
a chamber in the semiconductor substrate adjacent to the membrane film.

4. The apparatus of claim 2, further comprising:
a lid to cover the microphone device.

5. The apparatus of claim 4, further comprising:
a passivation layer on the second side of the semiconductor substrate, wherein the passivation layer is between at least a portion of the back-plate and the semiconductor substrate; and a cavity layer on the passivation layer and having a cavity formed in the cavity layer, wherein the membrane film is in the cavity and the lid is coupled with the cavity layer.

6. The apparatus of claim 4, wherein the lid includes a sound port hole.

7. The apparatus of claim 4, further comprising a flip-chip substrate including a sound port hole, wherein:
the semiconductor substrate is part of a die that is coupled with the flip-chip substrate in a flip-chip configuration;
the lid is coupled with the flip-chip substrate to form a cavity;
the die is within the cavity; and
the sound port hole provides access for sound to the cavity.

8. The apparatus of claim 1, wherein:
the semiconductor substrate is part of a first die;
the first die is coupled with a second die; and
the second die includes receiver or sensor circuitry of the microphone device.

9. The apparatus of claim 1, wherein the microphone device is one of a plurality of microphone devices on the second side of the semiconductor substrate.

10. A computing device comprising:
a circuit board; and
a die electrically coupled with the circuit board, the die including:
a semiconductor substrate having a first side and a second side opposite to the first side;
an interconnect layer on the first side of the semiconductor substrate;
a first through-silicon via (TSV) through the semiconductor substrate, the first TSV to route electrical signals between the first side of the semiconductor substrate and the second side of the semiconductor substrate;
a microphone device on the second side of the semiconductor substrate and electrically coupled with the first TSV;
a device layer on the first side of the semiconductor substrate, wherein the first TSV is to route electrical signals between an active device of the device layer and the microphone device; and
a second TSV to structurally support the microphone device, wherein the second TSV is not to route electrical signals between the device layer and the microphone device.

11. The computing device of claim 10, wherein:
the die is coupled with a package substrate; and
the package substrate is coupled with the circuit board.

12. The computing device of claim 10, wherein:
the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, and a camera.

13. The computing device of claim 10, wherein the microphone device comprises:
a back-plate on the second side of the semiconductor substrate and coupled with the first TSV; and
a membrane film coupled with the back-plate to form a capacitor.

14. The computing device of claim 13, wherein the microphone device further comprises:
a chamber in the semiconductor substrate adjacent to the membrane film.

15. The computing device of claim 13, further comprising:
a lid to cover the microphone device.

16. The computing device of claim 15, further comprising:
a passivation layer on the second side of the semiconductor substrate, wherein the passivation layer is between at least a portion of the back-plate and the semiconductor substrate; and
a cavity layer on the passivation layer and having a cavity formed in the cavity layer, wherein the membrane film is in the cavity and the lid is coupled with the cavity layer.

17. The computing device of claim 15, wherein the lid includes a sound port hole.

18. The computing device of claim 15, further comprising a flip-chip substrate including a sound port hole, wherein:
the die is coupled with the flip-chip substrate in a flip-chip configuration;
the lid is coupled with the flip-chip substrate to form a cavity;
the die is within the cavity; and
the sound port hole provides access for sound to the cavity.

19. An apparatus comprising:
a semiconductor substrate having a first side and a second side opposite to the first side;
an interconnect layer on the first side of the semiconductor substrate;
a through-silicon via (TSV) through the semiconductor substrate, the TSV to route electrical signals between the first side of the semiconductor substrate and the second side of the semiconductor substrate;
a microphone device on the second side of the semiconductor substrate and electrically coupled with the TSV, wherein the microphone device comprises:
a back-plate on the second side of the semiconductor substrate and coupled with the TSV; and
a membrane film coupled with the back-plate to form a capacitor;
a lid to cover the microphone device;
a passivation layer on the second side of the semiconductor substrate, wherein the passivation layer is between at least a portion of the back-plate and the semiconductor substrate; and
a cavity layer on the passivation layer and having a cavity formed in the cavity layer, wherein the membrane film is in the cavity and the lid is coupled with the cavity layer.

20. The apparatus of claim 19, wherein the microphone device further comprises:
a chamber in the semiconductor substrate adjacent to the membrane film.

21. The apparatus of claim 19, wherein the lid includes a sound port hole.

* * * * *